United States Patent
Sakai et al.

(10) Patent No.: US 8,783,838 B2
(45) Date of Patent: Jul. 22, 2014

(54) LIQUID EJECTING HEAD, LIQUID EJECTING APPARATUS, AND PIEZOELECTRIC ELEMENT

(71) Applicant: Seiko Epson Corporation, Tokyo (JP)

(72) Inventors: Tomohiro Sakai, Chino (JP); Tsutomu Asakawa, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/744,709

(22) Filed: Jan. 18, 2013

(65) Prior Publication Data

US 2013/0187990 A1    Jul. 25, 2013

(30) Foreign Application Priority Data

Jan. 19, 2012    (JP) .................................. 2012-009417

(51) Int. Cl.
*B41J 2/14*    (2006.01)
*H01L 41/187*    (2006.01)

(52) U.S. Cl.
USPC ............................................. 347/71; 310/311

(58) Field of Classification Search
USPC .......................................................... 347/71
See application file for complete search history.

(56) References Cited

U.S. PATENT DOCUMENTS

| | | | |
|---|---|---|---|
| 2005/0146249 A1* | 7/2005 | Miyazawa et al. | 310/358 |
| 2007/0241642 A1 | 10/2007 | Miyazawa et al. | |
| 2009/0230211 A1 | 9/2009 | Kobayashi et al. | |
| 2013/0145589 A1* | 6/2013 | Sakai | 29/25.35 |

FOREIGN PATENT DOCUMENTS

| | | | |
|---|---|---|---|
| JP | 2001-223404 | | 8/2001 |
| JP | 2006261412 A | * | 9/2006 |
| JP | 2007-287745 | | 11/2007 |
| JP | 2009-242229 | | 10/2009 |
| JP | 2009-252789 | | 10/2009 |

* cited by examiner

*Primary Examiner* — Lisa M Solomon
(74) *Attorney, Agent, or Firm* — Harness, Dickey & Pierce, P.L.C.

(57) ABSTRACT

A piezoelectric layer includes a buffer layer containing an oxide containing Bi and Co and disposed on an electrode, and a layer disposed on the buffer layer and containing a perovskite oxide containing Bi, Ba, Fe and Ti. A piezoelectric element includes the piezoelectric layer and the electrode. A liquid ejecting head includes a pressure generating chamber communicating with a nozzle aperture, and the piezoelectric element. A liquid ejecting apparatus includes the liquid ejecting head.

9 Claims, 18 Drawing Sheets

FIG. 6

| | BFO | Co-CONTAINING COMPOSITION | CONTENT | Bi CONCENTRATION (mol/l) | MOLE RATIO IN B SITE Fe | MOLE RATIO IN B SITE Co | MOLE RATIO IN B SITE Ti | FIRING TEMPERATURE (°C) | HEAT-UP RATE (°C/sec) |
|---|---|---|---|---|---|---|---|---|---|
| EXAMPLE 1 | 93% | Bi(Co, Ti)Oy | 7% | 0.25 | 93% | 3.5% | 3.5% | 650 | 300 |
| EXAMPLE 2 | 93% | Bi(Co, Ti)Oy | 7% | 0.25 | 93% | 3.5% | 3.5% | 750 | 400 |
| EXAMPLE 3 | 96% | Co | 4% | 0.25 | 96% | 4% | 0% | 750 | 400 |
| EXAMPLE 4 | 85% | Bi(Co, Ti)Oy | 15% | 0.25 | 85% | 7.5% | 7.5% | 750 | 400 |
| EXAMPLE 5 | 92% | BiCoOy | 8% | 0.25 | 92% | 8% | 0% | 750 | 400 |
| EXAMPLE 6 | 93% | Bi(Co, Ti)Oy | 7% | 0.25 | 93% | 3.5% | 3.5% | 750 | 1 |
| EXAMPLE 7 | 85% | Bi(Co, Ti)Oy | 15% | 0.0625 | 85% | 7.5% | 7.5% | 750 | 400 |
| EXAMPLE 8 | 80% | Bi(Co, Ti)Oy | 20% | 0.03125 | 80% | 10% | 10% | 750 | 400 |
| EXAMPLE 9 | 0% | BiCoOy | 100% | 0.03125 | 0% | 100% | 0% | 750 | 1 |

FIG. 12A

| PLANE INDICES OF ORIENTED LAYER | ANGLE $\chi_{100}$ BETWEEN (100) PLANE AND ORIENTED PLANE | ANGLE $\chi_{110}$ BETWEEN (110) PLANE AND ORIENTED PLANE | ANGLE $\chi_{111}$ BETWEEN (111) PLANE AND ORIENTED PLANE |
|---|---|---|---|
| ⟨100⟩ | 0 | 45 | 54.7 |
| ⟨110⟩ | 45 | 0 | 35.7 |
| ⟨111⟩ | 54.7 | 35.3 | 0 |

FIG. 12B

| | ANGLE $\chi_{100}$ BETWEEN (100) PLANE AND ORIENTED PLANE | ANGLE $\chi_{110}$ BETWEEN (110) PLANE AND ORIENTED PLANE | PLANE INDICES OF ORIENTED LAYER | CRACKS |
|---|---|---|---|---|
| EXAMPLE 1 | 15.5 | 31.5 | ⟨821⟩ | SUPPRESSED |
| EXAMPLE 2 | 12.9 | 35.4 | ⟨611⟩ | SUPPRESSED |
| EXAMPLE 3 | 13.1 | 36.5 | ⟨611⟩ | SUPPRESSED |
| EXAMPLE 4 | 23 | 32.1 | ⟨1033⟩ | SUPPRESSED |
| EXAMPLE 5 | 10.5 | 37 | ⟨2743⟩ | SUPPRESSED |
| EXAMPLE 6 | 12 | 35.1 | ⟨1732⟩ | SUPPRESSED |
| EXAMPLE 7 | 28.3 | 24.6 | ⟨732⟩ | SUPPRESSED |
| EXAMPLE 8 | 54.7 | 35.3 | ⟨111⟩ | SUPPRESSED |
| EXAMPLE 9 | 54.7 | 35.3 | ⟨111⟩ | SUPPRESSED |
| COMPARATIVE EXAMPLE 1 | | | ⟨110⟩ | OCCURRED |

———— 150 micron

———— 150 micron

———— 150 micron

———— 150 micron

——— 150 micron

——— 150 micron

———— 150 micron

———— 150 micron

———— 150 micron

———— 150 micron

LIQUID EJECTING HEAD, LIQUID EJECTING APPARATUS, AND PIEZOELECTRIC ELEMENT

The entire disclosure of Japanese Patent Application No. 2012-009417, filed Jan. 19, 2012 is incorporated by reference herein.

BACKGROUND

1. Technical Field

The present invention relates to a liquid ejecting head, a liquid ejecting apparatus, and a piezoelectric element.

2. Related Art

Piezoelectric materials, which are charged by distorting their crystals or are distorted by being placed in an electric field, are widely used in sensors, and in actuators used in ink jet printers or the like. PZT (lead zirconate titanate, $Pb(Zr_x, Ti_{1-x})O_3$) is a typical piezoelectric material. Unfortunately, PZT contains lead (Pb). From the viewpoint of reducing the environmental load, a lot of research and development has been conducted for lead-free piezoelectric materials.

Researched and development has recently been conducted for lead-free piezoelectric thin films and thin-film piezoelectric elements using the lead-free piezoelectric thin films. The thin-film piezoelectric element can be manufactured, for example, by forming a piezoelectric thin film to a thickness of several micrometers or less on an electrode disposed on a substrate and forming an upper electrode on the piezoelectric thin film. This process is performed as finely as semiconductor processes, and accordingly can advantageously provide a structure including thin-film piezoelectric elements arranged at a higher density than a structure including piezoelectric elements using a bulk piezoelectric material. For example, $BiFeO_3$—$BaTiO_3$ materials disclosed in JPA-2009-252789 exhibit superior characteristics as a lead-free thin-film piezoelectric material.

For forming a piezoelectric thin film by a liquid phase method, such as spin coating, the piezoelectric thin film is formed by applying a precursor solution onto a first electrode, and crystallizing the coating of the precursor solution. Then, a second electrode is formed on the piezoelectric thin film to complete a piezoelectric element.

JP-A-2009-242229 proposes that a $(Ba,Bi)(Ti,Fe,Mn)O_3$ lead-free piezoelectric film be formed by a gas-phase method, such as pulsed laser deposition (PLD).

When a piezoelectric element was formed using a $BiFeO_3$—$BaTiO_3$ piezoelectric material, however, the $BiFeO_3$—$BaTiO_3$ piezoelectric thin film was easier to crack than PZT thin films. It was thus found that $BiFeO_3$—$BaTiO_3$ piezoelectric materials are difficult to put to practical use. This disadvantage can arise not only in liquid ejecting heads, but also in piezoelectric actuators and sensors.

SUMMARY

An advantage of some aspects of the invention is to enhance the performance of piezoelectric elements, liquid ejecting heads and liquid ejecting apparatuses using a lead-free or low-lead piezoelectric material.

According to an aspect of the invention, a liquid ejecting head is provided which includes a pressure generating chamber communicating with a nozzle aperture, and a piezoelectric element including a piezoelectric layer and an electrode. The piezoelectric layer includes a buffer layer containing an oxide containing bismuth (Bi) and cobalt (Co) and disposed on the electrode, and a layer disposed on the buffer layer and containing of a perovskite oxide containing Bi, barium (Ba), iron (Fe) and titanium (Ti).

In another aspect of the invention, a liquid ejecting apparatus including the liquid ejecting head is provided.

According to still another aspect of the invention, a piezoelectric element including a piezoelectric layer and an electrode is provided. The piezoelectric layer includes a buffer layer containing an oxide containing Bi and Co and disposed on the electrode, and a layer disposed on the buffer layer and containing a perovskite oxide containing Bi, Ba, Fe and Ti.

In the piezoelectric layer, the buffer layer containing an oxide containing Bi and Co is disposed on the electrode, and the layer containing a perovskite oxide containing Bi, Ba, Fe and Ti is disposed on the buffer layer. It has been found that a piezoelectric element including a piezoelectric layer including a layer of a perovskite oxide containing Bi, Ba, Fe and Ti and provided with the buffer layer therein can suppress the occurrence of cracks in the piezoelectric layer in comparison with a piezoelectric element including a piezoelectric layer including a layer of the perovskite oxide but not provided with the buffer layer.

When a piezoelectric layer including a perovskite oxide layer containing Bi, Ba, Fe and Ti is formed directly on an electrode without forming a buffer layer, the piezoelectric layer will be naturally oriented in the (110) plane. The inventors, however, found that when a piezoelectric layer is formed on a buffer layer containing an oxide containing Bi and Co formed on the electrode, the oriented plane of the piezoelectric layer is changed from the (110) plane. It is expected that this finding will reach a solution to the occurrence of cracks in the piezoelectric layer.

The perovskite oxide may contain manganese (Mn) or any other metal in addition to Bi, Ba, Fe and Ti to improve the characteristics, for example, to prevent leakage current, or may contain impurities as long as the oxide has a perovskite structure. Also, the oxide of the buffer layer may contain Ti or any other metal in addition to Bi and Co to improve the characteristics, for example, to reduce leakage current, or may contain impurities.

If the oxide of the buffer layer contains Fe, the buffer layer can suppress the diffusion of Co into the layer of the perovskite oxide containing Bi, Ba, Fe and Ti. If the oxide of the buffer layer contains Ti, the insulation of the piezoelectric layer can be increased (to reduce leakage current).

If the perovskite oxide of the layer on the buffer layer contains Mn, the insulation of the piezoelectric layer can be increased (to reduce leakage current).

BRIEF DESCRIPTION OF THE DRAWINGS

The invention will be described with reference to the accompanying drawings, wherein like numbers reference like elements.

FIG. 6 is a representation of conditions of Examples.

FIG. 12A is a table showing the angle $\chi_{100}$ between the (100) plane and the oriented plane when the oriented layer has plane indices of <100>, the angle $\chi_{110}$ between the (110) plane and the oriented plane when the oriented layer has plane indices of <110>, and the angle $\chi_{111}$ between the (111) plane and the oriented plane when the oriented layer has plane indices of <111>, and FIG. 12B is a table showing the results of the Examples and Comparative Example.

DESCRIPTION OF EXEMPLARY EMBODIMENTS

Embodiments of the invention will now be described. The following embodiments are described merely by way of example of the invention.

(1) GENERAL DESCRIPTION OF PIEZOELECTRIC ELEMENT, LIQUID EJECTING HEAD AND LIQUID EJECTING APPARATUS

Figure 1A:
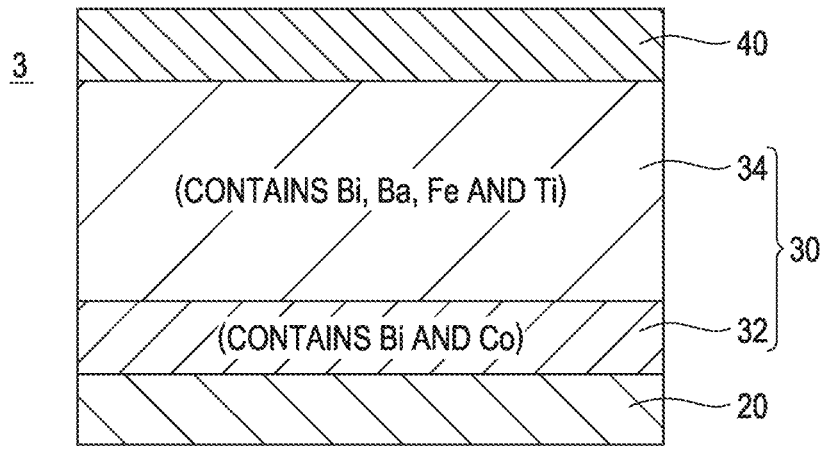
FIG. 1A is a schematic sectional view of a piezoelectric element according to an embodiment of the invention.

A piezoelectric element, a liquid ejecting head and a liquid ejecting apparatus according to an embodiment of the invention will first be described with reference to FIGS. 1A to 5. FIG. 1A shows a piezoelectric element 3. The piezoelectric element 3 includes a piezoelectric layer 30 and electrodes 20 and 40. FIG. 2 shows a recording head (liquid ejecting head) 1. The recording head 1 includes the piezoelectric elements 3 and pressure generating chambers 12 each communicating with a corresponding nozzle aperture 71. The pressure in the pressure generating chamber 12 is varied by the piezoelectric element 3. The liquid ejecting head 1 can be manufactured in a process including the steps of forming the piezoelectric elements 3 and of forming the pressure generating chambers 12. The pressure generating chambers 12 are formed in a silicon substrate 15 of a flow channel substrate 10. The nozzle apertures 71 are formed in a nozzle plate 70. The flow channel substrate 10 has an elastic film (vibration plate) 16, and a lower electrode (first electrode) 20, a piezoelectric layer 30 and an upper electrode (second electrode) 40 are formed in that order on the elastic film 16. The nozzle plate 70 is bonded to the silicon substrate 15 having the pressure generating chambers 12 therein. The recording apparatus (liquid ejecting apparatus) 200 includes such a liquid ejecting head.

The positional relations of the components described herein are illustrated by way of example and are not intended to limit the invention. Therefore, the second electrode may be disposed at a position other than above the first electrode. For example, the second electrode may be disposed to the left or right of the first electrode or below the first electrode.

As shown in FIG. 1A, the piezoelectric layer 30 includes a buffer layer 32 and a BF-BT layer 34. The buffer layer 32 is disposed on the lower electrode 20, and contains an oxide containing Bi and Co. The oxide of the buffer layer 32 is preferably a perovskite oxide from the viewpoint of enhancing the piezoelectric characteristics of the piezoelectric layer 30. However, the oxide need not have a perovskite structure, or the buffer layer 32 may contain a perovskite oxide as a main constituent, and an oxide other than perovskite oxides (for example, a metal oxide). The oxide of the buffer layer 32 may contain Bi and Co as main constituents and another metal (such as Fe, Ti, or Mn), or contain Bi, Co and Fe as main constituents and another metal (such as Ti or Mn). In the present embodiment, the sum of the molar fractions of the main constituents is higher than the molar factions of the other constituents. The buffer layer 32 may contain a substance other than the oxide (for example, impurities). The buffer layer 32 can be formed by a liquid phase method, such as spin coating, dip coating, or an ink jet method, or by a gas phase method, such as sputtering, pulsed laser deposition (PLD), or metal-organic chemical vapor deposition (MOCVD).

If the oxide of the buffer layer 32 has a perovskite structure, each metal in the oxide is located in a site in the perovskite structure according to the atomic radius thereof. In the perovskite oxide containing Bi and Co, Bi is present in the A site and Co is present in the B site. Such perovskite oxides include oxides having any one of the compositions expressed by the following general formulas:

$$BiCoO_y \qquad (1)$$

$$(Bi,MA)CoO_y \qquad (2)$$

$$Bi(Co,MB)O_y \qquad (3)$$

$$(Bi,MA)(Co,MB)O_y \qquad (4)$$

MA in formulas (2) and (4) represents at least one metal element other than Bi (preferably Bi and Pb), and MB in formulas (3) and (4) represents at least one metal element other than Co (preferably Co and Pb). Also, y represents a number of, generally, 3, but may vary from 3 as long as the oxide has a perovskite structure. The ratio of the amount by mole of the A site elements to the amount by mole of the B site elements is generally 1:1, but may vary from 1:1 as long as the oxide has a perovskite structure.

The ratio of the amount by mole of Bi to the sum of the amounts by mole of Bi and MA may be, for example, in the range of about 0.1% to 50%. The ratio of the amount by mole of Co to the sum of the amounts by mole of Co and MB is higher than the ratio of the amount by mole of Co in the B site of the BF-BT layer 34 to the sum of the amounts by mole of the metals constituting the B site of the BF-BT layer 34, and may be in the range of about 3% to 99.9%.

Elements represented by MB include Fe, Ti, and Mn. The percentage of the mole concentration of Fe in the B site to the total of the mole concentrations of the metals constituting the B site may be about 0.1% to 97%. If Fe is added to the buffer layer, it is expected that the diffusion of Co into the BF-BT layer 34 is suppressed. However, a piezoelectric element having piezoelectric characteristics can be produced without adding Fe. The percentage of the mole concentration of Ti in the B site to the total of the mole concentrations of the metals constituting the B site may be about 0.1% to 50%. If Ti is added to the buffer layer, it is expected that the insulation of the piezoelectric layer is increased (to reduce leakage current).

The buffer layer 32 may have a thickness of, but not limited to, about 10 to 200 nm. The ratio of the thickness of the buffer layer 32 to the total thickness of the piezoelectric layer 30 may be in the range of about 0.01 to 0.3.

The BF-BT layer 34 is disposed on the buffer layer 32, and contains a perovskite oxide containing Bi, Ba, Fe and Ti. The perovskite oxide of the BF-BT layer 34 may contain another metal, such as Mn, in a small mole ratio to the main constituents of Bi, Ba, Fe and Ti. "BF-BT" mentioned herein means containing Bi, Ba, Fe and Ti, and may contain another metal, such as Mn. The BF-BT layer 34 may further contain a substance, such as a metal oxide, other than the perovskite oxide. The BF-BT layer 34 can be formed by a liquid process, such as spin coating, dip coating, or an ink jet method, or by a gas phase process, such as sputtering, PLD, or MOCVD.

Each metal in the perovskite oxide of the BF-BT layer 34 is located in a site in the perovskite structure according to the atomic radius thereof. In the perovskite oxide of the BF-BT layer 34, Bi and Ba are present in the A site and Fe and Ti are present in the B site. Such perovskite oxides include lead-free oxides having any one of the compositions expressed by the following general formulas:

$$(Bi,Ba)(Fe,Ti)O_z \quad (5)$$

$$(Bi,Ba,MA)(Fe,Ti)O_z \quad (6)$$

$$(Bi,Ba)(Fe,Ti,MB)O_z \quad (7)$$

$$(Bi,Ba,MA)(Fe,Ti,MB)O_z \quad (8)$$

MA in formulas (6) and (8) represents at least one metal element other than Bi, Ba or Pb, and MB in formulas (7) and (8) represents at least one metal element other than Fe, Ti or Pb. Also, z represents a number of, generally, 3, but may vary from 3 as long as the oxide has a perovskite structure. The ratio of the amount by mole of the A site elements to the amount by mole of the B site elements is generally 1:1, but may vary from 1:1 as long as the oxide has a perovskite structure.

The ratio of the amount by mole of Bi to the sum of the amounts by mole of Bi, Ba and MA may be, for example, in the range of about 50% to 99.9%. The ratio of the amount by mole of Ba to the sum of the amounts by mole of Bi, Ba and MA may be, for example, in the range of about 0.1% to 50%. The ratio of the amount by mole of MA to the sum of the amounts by mole of Bi, Ba and MA may be, for example, in the range of about 0.1% to 33%.

The ratio of the amount by mole of Fe to the sum of the amounts by mole of Fe, Ti and MB may be, for example, in the range of about 50% to 99.9%. The ratio of the amount by mole of Ti to the sum of the amounts by mole of Fe, Ti and MB may be, for example, in the range of about 0.1% to 50%. The ratio of the amount by mole of MB to the sum of the amounts by mole of Fe, Ti and MB may be, for example, in the range of about 0.1% to 33%. If MB contains Co, the ratio (Ratio$_{CoBFBT}$) of the amount by mole of Co to the sum of the amounts by mole of Fe, Ti and MB is controlled so as to be lower than the ratio (Ratio$_{CoBC}$) of the amount by mole of Co in the B site of the buffer layer 32 to the sum of the amounts by mole of the metals constituting the B site of the buffer layer 32. For example, the percentage of Ratio$_{CoBFBT}$/Ratio$_{CoBC}$ can be about 0.1% to 20%.

Elements represented by MB include Mn. The percentage of the mole concentration of Mn in the B site to the total of the mole concentrations of the metals constituting the B site may be about 0.1% to 10%. If Mn is added to the BF-BT layer, it is expected that the insulation of the piezoelectric layer is increased (to reduce leakage current).

The BF-BT layer 34 may have a thickness of, but not limited to, about 0.2 to 5 μm. The ratio of the thickness of the BF-BT layer 34 to the total thickness of the piezoelectric layer 30 may be about 0.7 to 0.99.

When the BF-BT layer 34 is formed, the Co in the buffer layer 32 can slightly diffuse into the BF-BT layer 34. Allowing for this, the ratio of the amount by mole of Co in the entirety of the piezoelectric layer 30 to the total amount by mole of the metals constituting the B site of the buffer layer 32 can be, for example, in the range of about 3% to 99.9%. If the B site of the buffer layer 32 contains Fe in an amount by mole equal to or higher than the amount by mole of Co, the ratio of the amount by mole of Co in the entirety of the piezoelectric layer 30 to the amount by mole of Fe in the buffer layer 32 can be, for example, in the range of about 3% to 50%.

The electrodes 20 and 40 may contain one or more of Pt (platinum), Au (gold), Ir (iridium), Ti, and the like. Such a metal constituent may or may not be in the form of an oxide or any other compound. Also, the metal constituent may be in the form of an alloy or an elemental metal. The electrode may further contain another metal in a small mole ratio to those main constituents. Each of the electrodes 20 and 40 may have a thickness of, but not limited to, about 10 to 500 nm.

Figure 1B:
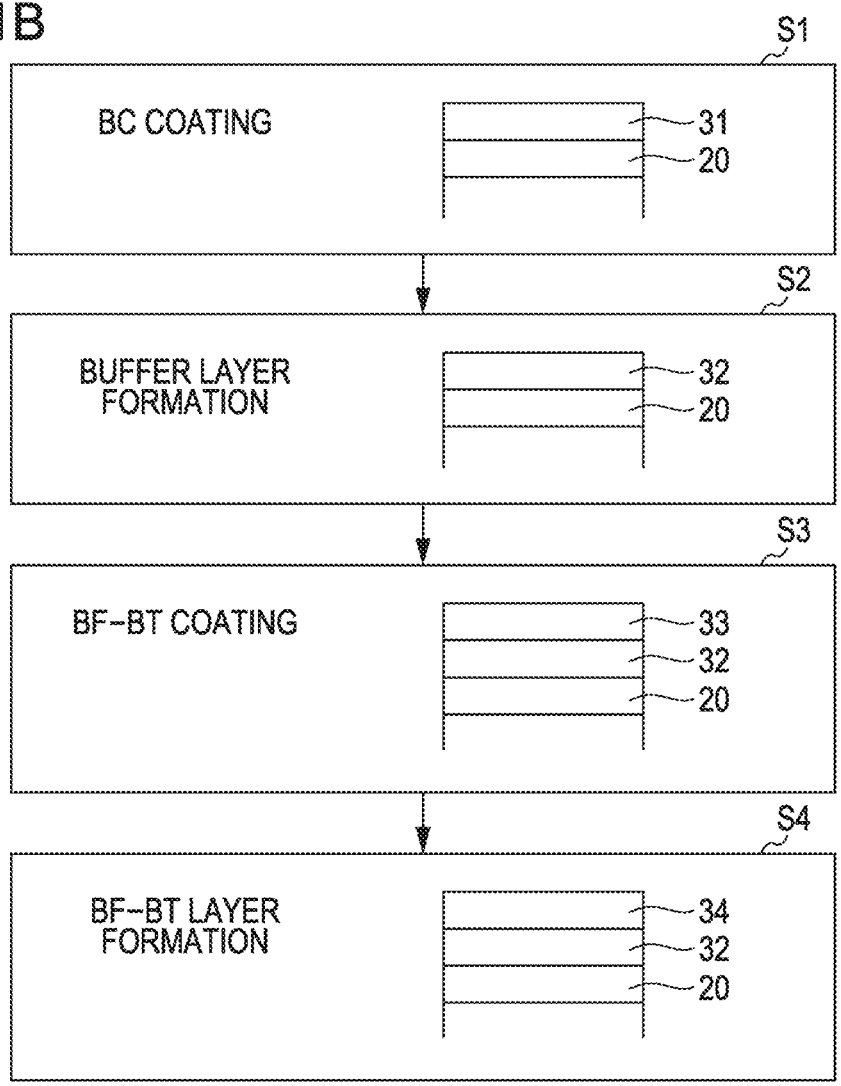
FIG. 1B is a schematic flow diagram of a process for manufacturing the piezoelectric element.
Figure 2:
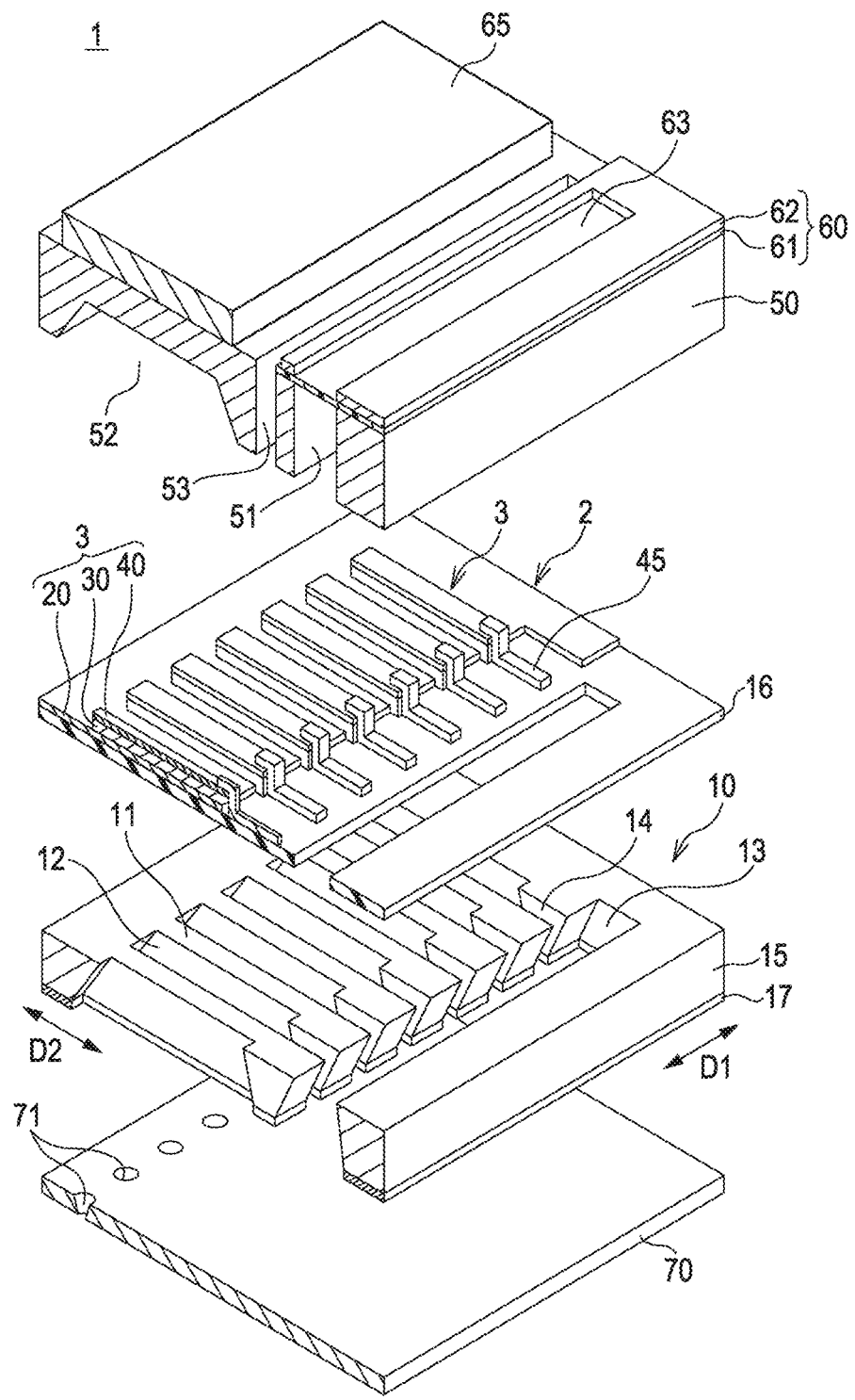
FIG. 2 is a schematic exploded perspective view of a recording head according to an embodiment of the invention.

The manufacturing process shown in FIG. 1B includes Steps S1 to S4.

In step S1 of BC coating, a buffer precursor solution 31 containing Bi and Co, that is, a precursor of the buffer layer 32, is applied onto the surface of the lower electrode 20 to form a coating. Metal other than Bi and Co may be contained in the buffer precursor solution 31 (for example, about 0.1% to 97% of Fe or about 0.1% to 50% of Ti). "BC" mentioned herein means containing Bi and Co, and may contain another metal, such as Fe. The precursor solution 31 may contain an organic metal salt, such as a 2-ethylhexanoate or an acetate. The precursor solution 31 may be a solution prepared by dissolving the metal salt in a solvent, or a sol prepared by dispersing the metal salt in a disperse medium. The solvent or the disperse medium may contain an organic solvent, such as octane, xylene, or a mixture of these organic solvents. The precursor solution 31 can be applied by a liquid phase method, such as spin coating. The coating may be formed to have a thickness of, but not limited to, about 0.1 μm.

In step S2 of buffer layer formation, the coating of the buffer precursor solution 31 is crystallized to form the buffer layer 32 containing an oxide (preferably a perovskite oxide). The oxide of the buffer layer 32 contains Bi and Co, and may further contain another metal in a small mole ratio to the main constituents of Bi and Co. The buffer layer 32 may further contain a substance, such as a metal oxide, other than the perovskite oxide. Each metal in the perovskite oxide is located in a site in the perovskite structure according to the atomic radius thereof. In the perovskite oxide, Bi is present in the A site and Co is present in the B site. Such perovskite oxides include lead-free oxides having any one of the compositions expressed by the above general formulas (1) to (4).

Before crystallizing the buffer precursor solution 31, a first heating step may be performed in which the coating of the buffer precursor solution 31 on the lower electrode 20 is heated at a temperature lower than the crystallization temperature of the perovskite oxide. Since the coating of the buffer precursor solution 31 is dried before being crystallized by this step, and can be further degreased at a temperature equal to or higher than the degreasing temperature of the precursor solution 31, a satisfactory buffer layer 32 can be formed. A second heating step may be performed to heat the coating of the precursor solution 31 at a temperature equal to or higher than the crystallization temperature. The coating of the precursor solution 31 can be thus fired into a satisfactory buffer layer 32. Various types of equipment can be used for heating. An infrared lamp-annealing apparatus that can be used for rapid thermal annealing (RTA) may be used for heating the precursor solution 31 at a temperature equal to or higher than the crystallization temperature. Thus, a satisfactory buffer layer 32 can be formed. After crystallizing the coating of the buffer precursor solution, the buffer precursor solution may further be applied over the surface of the resulting layer containing the perovskite oxide and then crystallizing the precursor solution to form a buffer layer having a multilayer structure including layers containing the perovskite oxide.

In the first heating step, the coating of the precursor solution 31 is heated at a drying temperature, and is then further heated at a degreasing temperature. In this instance, the relationship drying temperature<degreasing temperature<crystallization temperature holds true.

In step S3 of BF-BT coating, a BF-BT precursor solution 33 containing Bi, Ba, Fe and Ti, that is, a precursor of the BF-BT layer 34, is applied onto the surface of the buffer layer 32 to form a coating. The BF-BT precursor solution 33 may further contain another metal in a small mole ratio (for example, about 0.1% to 10% of Mn) to the main constituents of Bi, Ba, Fe and Ti. The precursor solution 33 may contain an organic metal salt, such as a 2-ethylhexanoate or an acetate. The precursor solution may be a solution prepared by dissolving the metal salt in a solvent, or a sol prepared by dispersing the metal salt in a disperse medium. The solvent or the disperse medium may contain an organic solvent, such as octane or xylene, or a mixture of these organic solvents. The precursor solution 33 can be applied by a liquid phase method, such as spin coating. The coating may be formed to have a thickness of, but not limited to, about 0.1 μm.

In step S4 of BF-BT layer formation, the BF-BT precursor solution 33 is crystallized to form the BF-BT layer 34 containing a perovskite oxide. The perovskite oxide of the BF-BT layer 34 contains Bi, Ba, Fe and Ti, and may further contain another metal in a small mole ratio to the main constituents of Bi, Ba, Fe and Ti. The BF-BT layer 34 may further contain a substance, such as a metal oxide, other than the perovskite oxide. Each metal in the precursor of the BF-BT layer, such as the BF-BT precursor solution, is located in a site in the perovskite structure according to the atomic radius thereof. In the resulting perovskite oxide of the BF-BT layer 34, Bi and Ba are present in the A site and Fe and Ti are present in the B site. Such perovskite oxides include lead-free oxides having any one of the compositions expressed by the above general formulas (5) to (8).

Before crystallizing the BF-BT precursor solution 33, a first heating step may be performed in which the coating of the BF-BT precursor solution 33 on the buffer layer 32 is heated at a temperature lower than the crystallization temperature of the perovskite oxide. Since the coating of the BF-BT precursor solution 33 is dried before being crystallized by this step, and can be further degreased at a temperature equal to or higher than the degreasing temperature of the precursor solution 33, a satisfactory BF-BT layer 34 can be formed. A second heating step may be performed to heat the coating of the precursor solution 33 at a temperature equal to or higher than the crystallization temperature. Thus a satisfactory BF-BT layer 34 can be formed. Various types of equipment can be used for heating. An infrared lamp-annealing apparatus that can be used for RTA may be used for heating the precursor solution 33 at a temperature equal to or higher than the crystallization temperature. Thus, a satisfactory BF-BT layer 34 can be formed. After crystallizing the coating of the BF-BT precursor solution, the BF-BT precursor solution may further be applied over the surface of the resulting layer containing the perovskite oxide and then crystallized to form a BF-BT layer having a multilayer structure including layers containing the perovskite oxide.

In the first heating step, the coating of the precursor solution 33 is heated at a drying temperature, and is then further heated at a degreasing temperature. In this instance, the relationship drying temperature<degreasing temperature<crystallization temperature holds true.

The crystallization temperature of the piezoelectric layer 30 including the layer containing a perovskite oxide containing Bi, Ba, Fe, and Ti may be higher than 550° C. and lower than 900° C.

Figure 7:
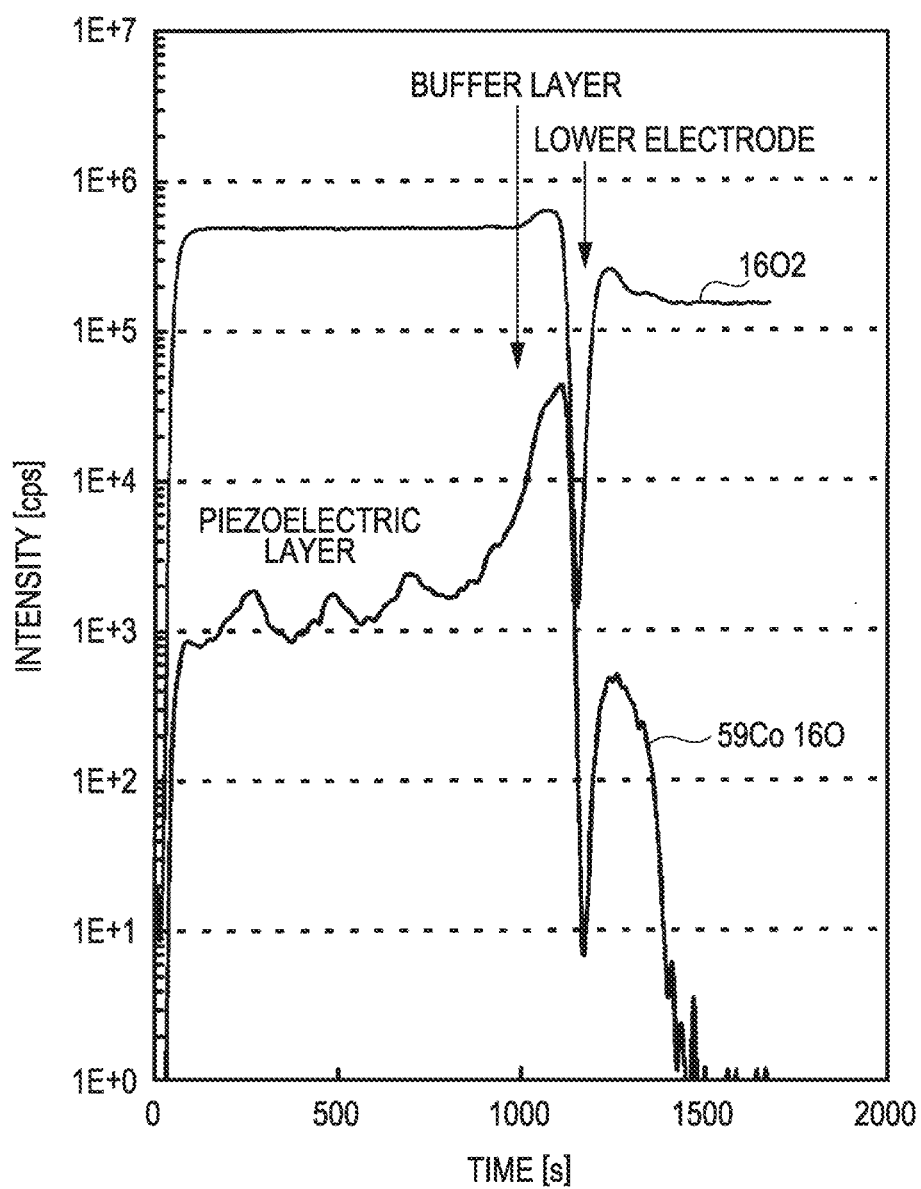
FIG. 7 is secondary ion mass (SIMS) spectra of Example 1.
Figure 8:
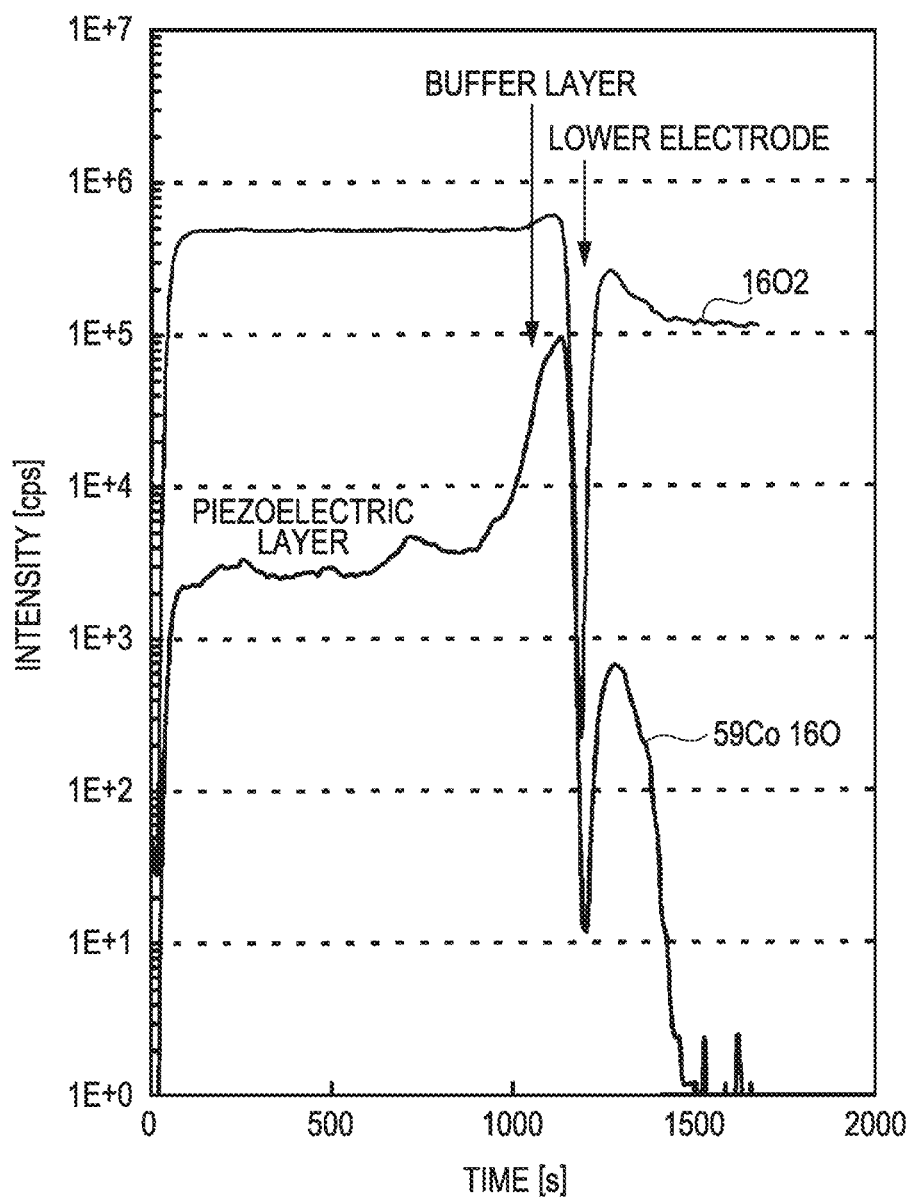
FIG. 8 is SIMS spectra of Example 2.
Figure 9:
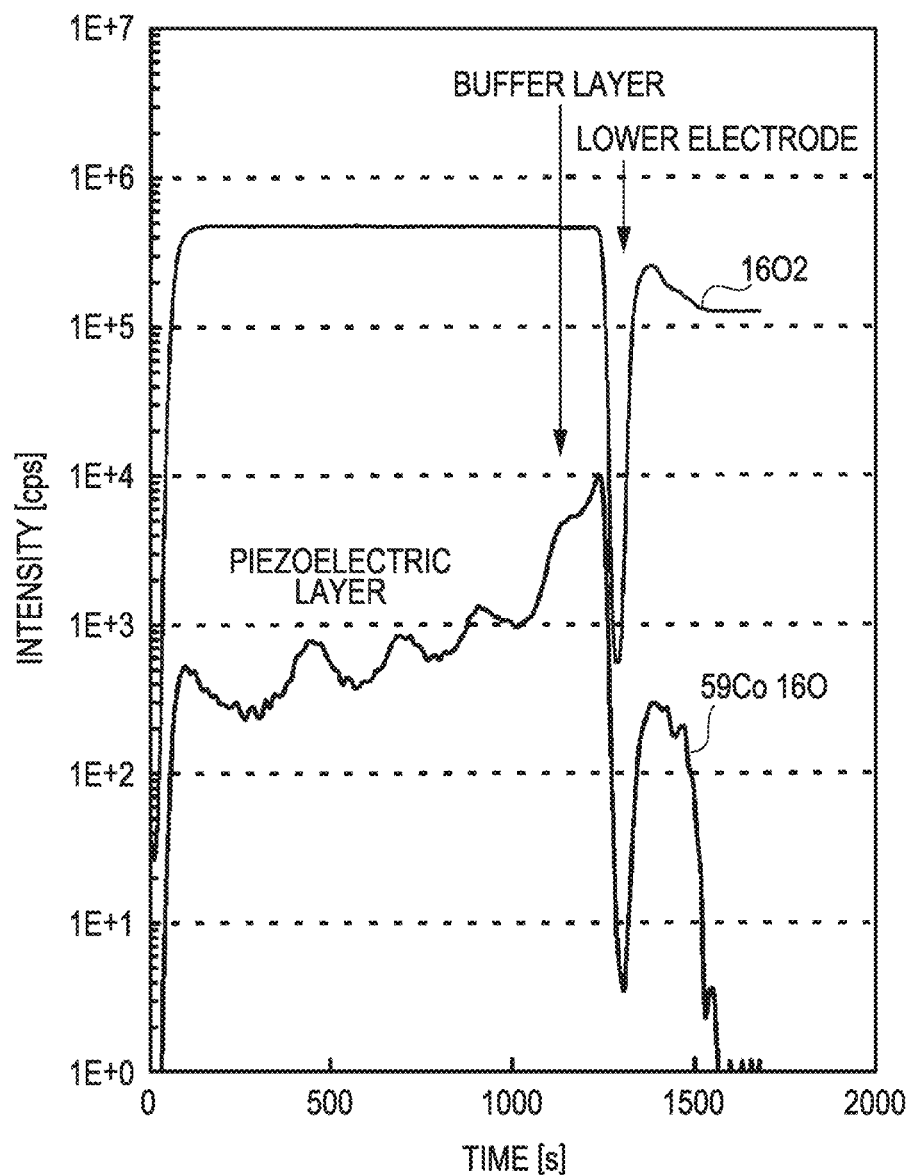
FIG. 9 is SIMS spectra of Example 8.

In the piezoelectric layer of the piezoelectric element according to the present embodiment, the buffer layer containing Bi and Co is disposed on the lower electrode, and the BF-BT layer containing little Co is formed on the buffer layer, as shown in FIGS. 7 to 9 that show the distributions of Co, measured by secondary ion mass spectrometry (SIMS). The above SIMS analysis was performed with a double-focusing SIMS analyzer IMS-7f manufactured by CAMECA by irradiating the sample with $Cs^+$ accelerated to 15 keV as a primary ion beam, and negative secondary ions $^{16}O_2^-$ and $(^{59}Co+^{16}O)^-$ were detected. For the SIMS analysis, electron beam irradiation was performed with a vertical electron gun to compensate for the influence of charge-up that often occurs when insulating materials are analyzed, and the measurement was performed in a high mass resolution mode to eliminate the influence of interfering ions. In FIGS. 7 to 9, the horizontal axis represents the measurement time (unit: second), and the vertical axis represents the common logarithm of the intensity of each element (unit: cps), "1E+i" (i represents an integer of 0 to 7) represents $10^i$, "16O2" represents $^{16}O_2^-$, and "59Co 16O" represents $(^{59}Co+^{16}O)^-$.

Figure 23:
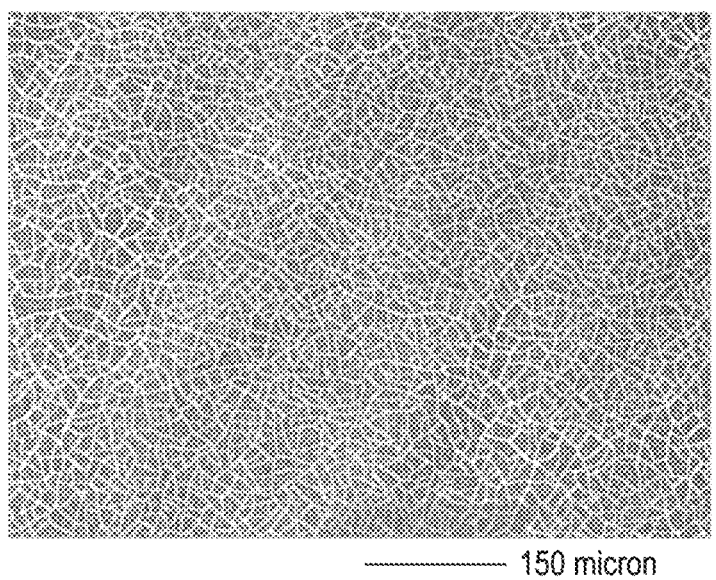
FIG. 23 is an image of the surface of a thin film of the Comparative Example.

If the BF-BT layer is directly formed on the electrode without forming the buffer layer 32, the plane indices of the oriented layer are <110>, as in the Comparative Example shown in FIG. 12B. In such a piezoelectric layer, cracks occur in the surface of the thin film as shown in FIG. 23.

If the buffer layer 32 is formed in the piezoelectric layer, the plane indices of the oriented layer varied from <110>, as shown in Examples 1 to 9 in FIG. 12B. In such a piezoelectric layer, the occurrence of cracks in the surface of the thin film is reduced, as in the thin film shown in FIGS. 14 to 22.

Accordingly, the plane indices of the oriented layer can be varied from <110> by forming a buffer layer containing an oxide containing Bi and Co on the electrode and forming the BF-BT layer on the buffer layer. It is expected that this finding can reach a solution to the occurrence of cracks in the piezoelectric layer. Also, by reducing the occurrence of cracks in the piezoelectric layer, the performance of the piezoelectric element using a lead-free or low-lead piezoelectric material can be enhanced.

(2) METHOD FOR MANUFACTURING PIEZOELECTRIC ELEMENT AND LIQUID EJECTING HEAD

FIG. 2 is an exploded perspective view of an ink jet recording head 1 according to an embodiment of the liquid ejecting head of the invention. FIGS. 3A to 4C are sectional views, taken in the longitudinal direction D2 of the pressure generating chamber 12, illustrating a method for manufacturing the recording head. The layers constituting the recording head 1 may be stacked and bonded together, or may be integrated by, for example, modifying the surfaces of the materials of the layers.

A flow channel substrate 10 may be formed of a monocrystalline silicon substrate or the like. An elastic film 16 may be formed of, for example, silicon dioxide ($SiO_2$), and be integrated with a silicon substrate 15 having a relatively large thickness of, for example, about 500 to 800 μm and a high rigidity by thermally oxidizing one surface of the silicon substrate 15 in a diffusion furnace of about 1100° C. The thickness of the elastic film 16 may be, but is not limited to, about 0.5 to 2 μm.

Figure 3A:
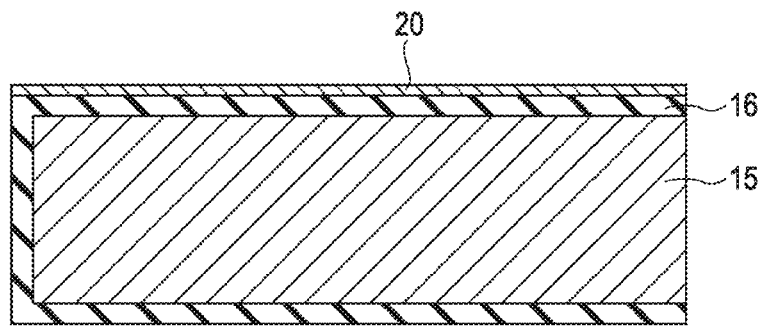
FIGS. 3A to 3C are sectional views illustrating a process for manufacturing the recording head.
Figure 3B:
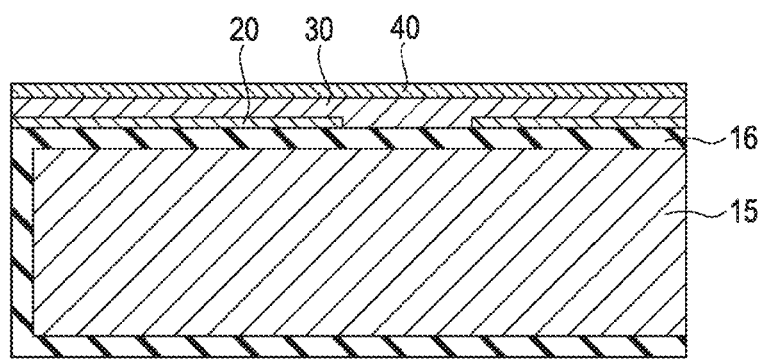

Subsequently, a lower electrode 20 is formed on the elastic film 16 by, for example, sputtering, as shown in FIG. 3A. In an embodiment, the lower electrode 20 may be patterned as shown in FIG. 3B. The thickness of the lower electrode 20 may be, but is not limited to, about 50 to 500 nm. An adhesive layer or anti-diffusion layer of titanium aluminum nitride (TiAlN), Ir, iridium oxide (IrO), zirconium oxide ($ZrO_2$) or the like may be formed between the elastic film 16 and the lower electrode 20.

Subsequently, as shown in FIG. 1B, the above-described buffer precursor solution 31 is applied onto the surface of the lower electrode 20 (BC coating step S1), and is then crystallized to form the buffer layer 32 containing an oxide (buffer layer formation step S2). If the coating of the buffer precursor solution 31 is heated at a temperature equal to or higher than the crystallization temperature of perovskite oxides, a thin-film buffer layer 32 containing a perovskite oxide is formed. Preferably, the coating is heated to a temperature of, for example, about 140 to 190° C. for drying (drying step), then further heated to a temperature of, for example, about 300 to 500° C. for degreasing (degreasing step), and is then further heated to a temperature of, for example, about 550 to 850° C. for crystallization (firing step).

Subsequently, the above-described BF-BT precursor solution 33 is applied onto the surface of the buffer layer 32 (BF-BT coating step S3), and the coating of the BF-BT precursor solution 33 is crystallized to form the BF-BT layer 34 containing a perovskite oxide (BF-BT layer formation step S4). If the coating of the BF-BT precursor solution 33 is heated at a temperature equal to or higher than the crystallization temperature of perovskite oxides, a thin-film BF-BT layer 34 containing a perovskite oxide is formed. Preferably, the coating is heated to a temperature of, for example, about 140 to 190° C. for drying (drying step), then further heated to a temperature of, for example, about 300 to 400° C. for degreasing (degreasing step), and is then further heated to a temperature of, for example, about 550 to 850° C. for crystallization (firing step).

In order to increase the thickness of the piezoelectric layer 30, a sequence of the steps S2 to S4 of coating, drying, degreasing and firing may be performed several times. In order to reduce the number of firing steps, a firing step may be performed after performing a sequence of the steps of coating, drying and degreasing several times. This combined operation may be performed several times.

The thickness of the piezoelectric layer 30 is not particularly limited as long as it has the function of electromechanical conversion, and may be, for example, about 0.2 to 5 μm. Preferably, the thickness of the piezoelectric layer 30 is controlled so as to be so large as the displacement of the piezoelectric layer 30 is satisfactory while being controlled so as to prevent cracks.

The heating equipment for the drying and degreasing steps may be a hot plate or an infrared lamp annealing apparatus that heats an object by irradiation from an infrared lamp. The heating equipment for the firing step may be an infrared lamp annealing apparatus. Preferably, heating is performed at a relatively high heat-up rate by, for example, RTA.

After the formation of the piezoelectric layer 30, the upper electrode 40 is formed on the piezoelectric layer 30 by, for example, sputtering, as shown in FIG. 3B. The thickness of the upper electrode 40 may be, but is not limited to, about 20 to 200 nm. In an embodiment as shown in FIG. 3C, the upper electrode 40 and the piezoelectric layer 30 are patterned into piezoelectric elements 3 that oppose the corresponding pressure generating chambers 12.

For forming the piezoelectric elements 3, in general, one of the electrodes of the piezoelectric elements 3 acts as a common electrode, and the other electrode and the piezoelectric layer 30 are formed for each pressure generating chamber 12 by patterning. In the piezoelectric element 3 shown in FIGS. 2 and 4A to 4C, the lower electrode 20 acts as a common electrode, and the upper electrode 40 is provided as discrete electrodes.

The piezoelectric elements 3, each including the piezoelectric layer 30 and the electrodes 20 and 40, are formed as described above, and thus, a piezoelectric actuator 2 including the piezoelectric elements 3 and the elastic film 16 is produced.

Figure 3C:
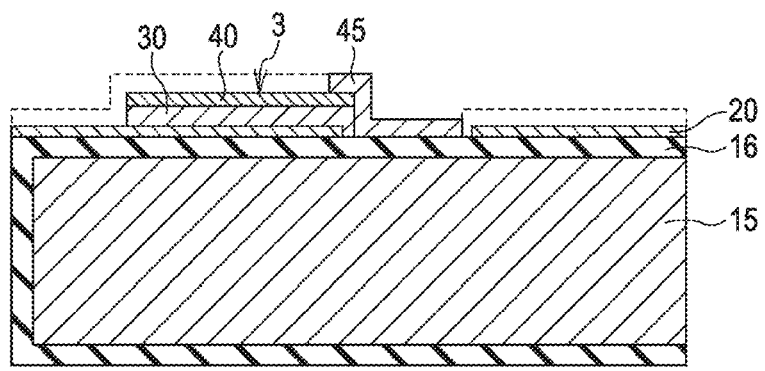

Subsequently, lead electrodes 45 are formed as shown in FIG. 3C. For example, a metal layer is formed over the entire surface of the flow channel substrate 10, and is then patterned into lead electrodes 45 corresponding to each of the piezoelectric elements 3 through a mask pattern of a resist or the like. The upper electrodes 40 shown in FIG. 2 are each connected to the corresponding lead electrode 45 extending on the elastic film 16 from the vicinity of an end of the ink supply channels 14.

The lower electrode 20, the upper electrode 40 and the lead electrode 45 may be formed by sputtering, such as DC (direct current) magnetron sputtering. The thickness of each electrode can be controlled by varying the voltage applied to the sputtering apparatus or the sputtering time.

Figure 4A:
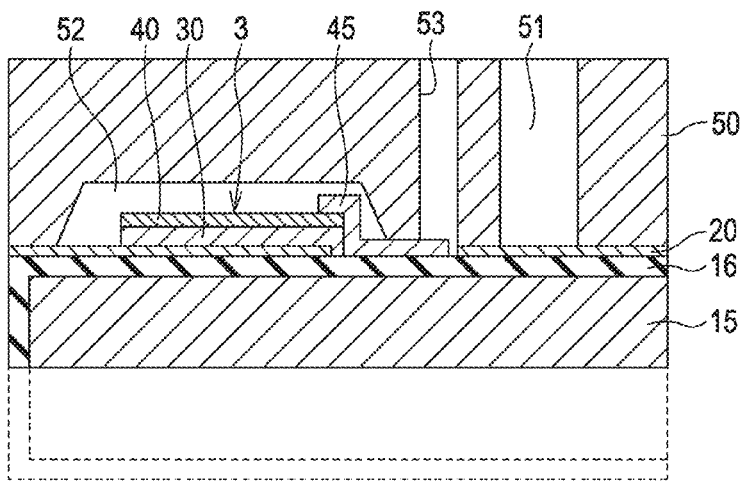
FIGS. 4A to 4C are sectional views illustrating the process for manufacturing the recording head.

Subsequently, as shown in FIG. 4A, a protective substrate 50 in which a piezoelectric element-protecting section 52 is formed is bonded to the flow channel substrate 10 with, for example, an adhesive. The protective substrate 50 is made of, for example, monocrystalline silicon, glass or ceramic. The protective substrate 50 may have a thickness of, but not limited to, about 300 to 500 μm. The protective substrate 50 has a reservoir section 51 passing through the thickness thereof. The reservoir section 51 and a communicating section 13 define a reservoir 9 acting as a common ink chamber (liquid chamber). The piezoelectric element-protecting section 52 is disposed in the region opposing the piezoelectric elements 3 and has a space so that the piezoelectric elements 3 can operate without interference. The protective substrate 50 also has a through hole 53, and the ends of the lead electrodes 45 extending from the piezoelectric elements 3 are exposed in the through hole 53.

Figure 4B:
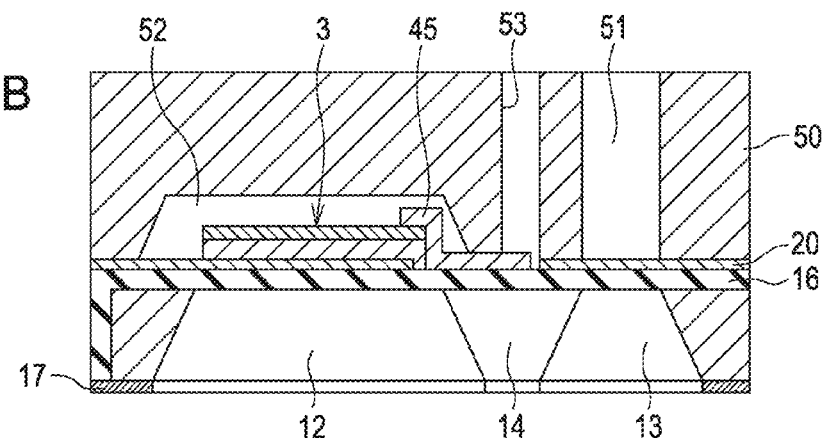

Subsequently, the silicon substrate 15 is ground to a certain thickness, and is then further wet-etched to a predetermined thickness (for example, about 60 to 80 µm) with fluoronitric acid. Then, a mask layer 17 is formed on the silicon substrate 15, and the silicon substrate 15 is patterned into a predetermined shape through the mask layer 17, as shown in FIG. 4B. The mask layer 17 may be formed of silicon nitride (SiN) or the like. Subsequently, the silicon substrate 15 is subjected to anisotropic etching (wet etching) with an alkali solution, such as a KOH solution. Thus, a plurality of liquid flow channels, each including a pressure generating chamber 12 and an ink supply channel 14 having a smaller width, and a communicating section 13 are formed. The pressure generating chambers 12 and the ink supply channels 14 are partitioned by partition members 11, and the communicating section 13 communicates with the ink supply channels 14 so as to act as a liquid flow channel common to the ink supply channels 14. The liquid flow channels including the pressure generating chambers 12 and the ink supply channels 14 are arranged in parallel in the width direction D1 of the pressure generating chambers 12.

The pressure generating chambers 12 may be formed before the formation of the piezoelectric elements 3.

Figure 4C:
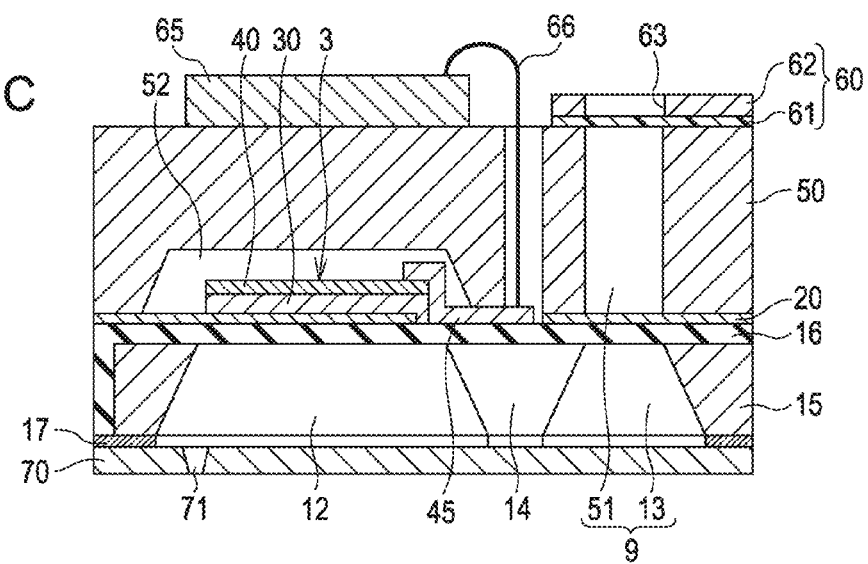

Subsequently, unnecessary outer portions of the flow channel substrate 10 and the protective substrate 50 are cut off by, for example, dicing. Then, as shown in FIG. 4C, the nozzle plate 70 is joined to the surface of the silicon substrate 15 opposite the protective substrate 50. The nozzle plate 70 can be made of glass ceramic, monocrystalline silicon, stainless steel, or the like, and is fixed to the open side of the flow channel substrate 10. For fixing the nozzle plate 70, an adhesive, a thermal fusion film or the like may be used. The nozzle plate 70 has nozzle apertures 71 therein to communicate with the vicinity of the ends of the pressure generating chambers 12 opposite the ink supply channels 14. Therefore, each of the pressure generating chambers 12 communicates with the corresponding nozzle aperture 71 through which liquid is discharged.

Subsequently, a compliance substrate 60 including a sealing film 61 and a fixing plate 62 is bonded on the protective substrate 50, followed by being cut into chips having predetermined dimensions. The sealing film 61, which may be made of a rigid and flexible material such as a polyphenylene sulfide (PPS) film having a thickness of about 4 to 8 µm, seals one side of the reservoir section 51. The fixing plate 62 may be made of a metal or any other hard material, such as stainless steel (SUS) having a thickness of about 20 to 40 µm, and in which an opening 63 is formed corresponding to the reservoir 9.

A drive circuit 65 is secured on the protective substrate 50 and will drive the piezoelectric elements 3 arranged in parallel. The drive circuit 65 may be a circuit board, a semiconductor integrated circuit (IC) or the like. The drive circuit 65 and the lead electrodes 45 are electrically connected to each other with connection wiring lines 66. The conduction wiring line 66 may be an electroconductive wire, such as a bonding wire. Through the above-described process steps, the recording head 1 is produced.

The recording head 1 draws an ink through an ink inlet connected to an external ink supply unit (not shown), and the ink is delivered to fill the spaces from the reservoir 9 to the nozzle apertures 71. When a voltage is applied between the lower electrode 20 and the upper electrode 40 for each pressure generating chamber 12 according to the recording signals from the drive circuit 65, ink droplets are discharged through the nozzle aperture 71 by the deformation of the piezoelectric layer 30, the lower electrode 20 and the elastic film 16.

The recording head may has a structure in which the lower electrode acts as a common electrode and the upper electrode act as discrete electrodes, a structure in which the upper electrode acts as a common electrode and the lower electrode acts as discrete electrodes, or a structure in which both the lower and the upper electrode act as common electrodes with discrete electrodes therebetween.

(3) LIQUID EJECTING APPARATUS

Figure 5:
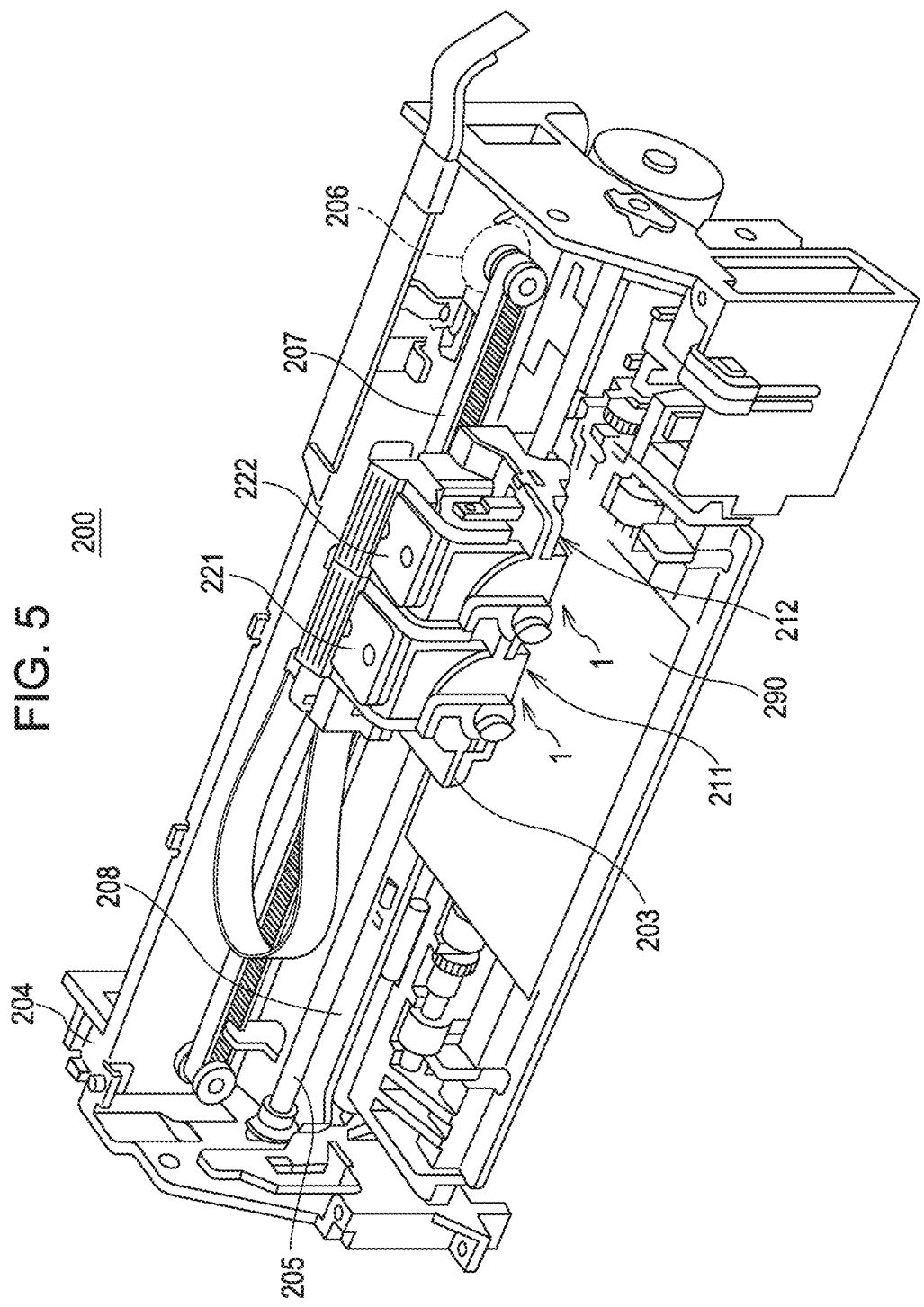
FIG. 5 is a schematic perspective view of a recording apparatus according to an embodiment of the invention.

FIG. 5 shows the appearance of a recording apparatus (liquid ejecting apparatus) 200 including the above-described recording head 1. In the recording apparatus 200, the recording heads 1 are incorporated in recording head units 211 and 212. The recording apparatus 200 shown in FIG. 5 includes the recording head units 211 and 212 respectively provided with the recording heads 1 therein, and removable ink cartridges 221 and 222 that are external ink supply units. A carriage 203 having the recording head units 211 and 212 is secured to a carriage shaft 205 fixed to an apparatus body 204 for movement along the shaft 205. The carriage 203 is moved along the carriage shaft 205 by transmitting the driving force from a driving motor 206 to the carriage 203 with a plurality of gears (not shown) and a timing belt 207. A recording sheet 290 fed by a feed roller (not shown) or the like is transported over a platen 208, and inks are supplied from the ink cartridges 221 and 222 and discharged from the recording heads 1. Printing is thus performed.

(4) EXAMPLES

Examples of the invention will now be described. However, the invention is not limited to the following Examples.
Forming of Lower Electrode-Formed Substrate A (100)-oriented monocrystalline silicon (Si) substrate was headed to oxidize the surface thereof in a diffusion furnace. Thus a 1200 nm tick silicon dioxide ($SiO_2$) film was formed at the surface of the Si substrate. Then, a 40 nm thick titanium (Ti) film was formed on the $SiO_2$ film by RF (high frequency) magnetron sputtering, and the Ti film was thermally oxidized into a titanium oxide ($TiO_x$) thin film. Furthermore, a 100 nm (111) plane-oriented platinum (Pt) thin film (lower electrode 20) was formed on the titanium oxide film by RF magnetron sputtering.

Examples 1 to 9

Preparation of Buffer Precursor Solution

Buffer precursor solutions having the compositions shown in FIG. 6 were prepared for Examples 1 to 9. "BFO" in FIG. 6 represents $BiFeO_x$, which is a perovskite oxide of the buffer layer. Although the x of $BiFeO_x$ is a number of, generally, 3, it may vary from 3 as long as the oxide has a perovskite structure. $Bi(Co,Ti)O_y$ added to the buffer layer is a perovskite oxide, and in which the amount by mole of Co and the amount by mole of Ti were set to be the same. Although the y of $Bi(Co,Ti)O_y$ and $BiCoO_y$ are a number of, generally, 3, it may vary from 3 as long as the oxides have perovskite structures. Each buffer precursor solution contains BFO in the ratio shown in the "BFO" column, and the Co-containing material shown in the "Co-containing composition" column in the ratio shown in the "Content" column. The buffer layer of Example 9 did not contain a perovskite oxide BFO. "Bi concentration" represents the mole concentration (unit: mol/L) of Bi in the buffer precursor solution. The columns of Fe, Co and Ti show the percentages by mole of the corresponding metals to the metals constituting the B site.

2-Ethylhexanoate salts were used as the precursor materials of the metal elements of Bi, Fe, Co and Ti. The mole concentration of Bi is shown in the column of "Bi concentration". The mole concentration of Fe is 0.25 mol/L in Example 3, and, in other Examples, the mole concentration of Fe is represented by the product of the mole concentration of Bi in the column of "Bi concentration" and the percentage in the column of "Fe". The mole concentration of Co is 0.25×4/100=0.01 mol/L in Example 3, and, in other Examples, the mole concentration of Co is represented by the product of the mole concentration of Bi in the column of "Bi concentration" and the percentage in the column of "Co". The mole concentration of Ti is represented by the product of the mole concentration of Bi in the column of "Bi concentration" and the percentage in the column of "Ti". N-octane was used as the solvent.

Forming of Buffer Layer-Formed Substrate

In each Example, a buffer precursor film was formed by spin coating of the buffer precursor solution dropped on the lower electrode of the lower electrode-formed substrate at 3000 rpm (BC coating step S1). Then, the substrate was heated and dried on a hot plate at 180° C. for 2 minutes (drying step). Also, degreasing was performed by heating the substrate to 450° C. for 2 minutes (degreasing step). The degreased substrate was fired in an oxygen atmosphere in an RTA apparatus at a heat-up rate (unit: ° C./s) and firing temperature (° C.) shown in FIG. 6 (firing step).

Preparation of BF-BT Precursor Solution

2-Ethylhexanoate salts were used as the precursor materials of the metal elements of Bi, Fe, Ti and Mn. The mole ratio of the metals was set to Bi:Ba:Fe:Ti:Mn=75:25:71.25:25:3.75. The intended perovskite oxide of the BF-BT layer was $(Bi, Ba)(Fe, Ti, Mn)O_z$. N-octane was used as the solvent.

Forming of BF-BT Layer-Formed Substrate

In each Example, the BF-BT precursor film was formed by spin coating of the BF-BT precursor solution dropped on the buffer layer of the buffer layer-formed substrate at 3000 rpm (BF-BT coating step S3). Then, the substrate was heated and dried on a hot plate at 180° C. for 2 minutes (drying step). Also, degreasing was performed by heating the substrate to 350° C. for 2 minutes (degreasing step). Furthermore, the degreased substrate was fired in an oxygen atmosphere at 750° C. in an RTA apparatus (firing step).

Then, a sequence of the steps of BF-BT coating and drying was repeated two times, and the sample was fired at 750° C. in an oxygen atmosphere in an RTA apparatus. Then, a combination of two sequences of the steps of BF-BT coating, drying and degreasing and the step of firing was repeated four times. Thus, a BF-BT layer including nine spin-coat layers was formed on the buffer layer. Thus, a piezoelectric layer having a thickness of 700 nm in total, including the buffer layer, was formed by 10 coating operations including one for forming the buffer layer and nine for forming the BF-BT thin films.

Comparative Example

The same solution as in Examples 1 to 9 was used as the BF-BT precursor solution. A piezoelectric layer having no buffer layer was formed on the lower electrode of the lower electrode-formed substrate by dropping the BF-BT precursor solution on the lower electrode under the same conditions as in Examples 1 to 9.

Forming of Piezoelectric Element

In the Examples and the Comparative Example, a 100 nm thick platinum thin film (upper electrode 40) was formed on the piezoelectric layer of the BF-BT layer-formed substrate by sputtering, and the resulting structure was fired in an oxygen atmosphere at 750° C. in an RTA apparatus for 5 minutes to complete a piezoelectric element.

SIMS Analysis

The BF-BT layer-formed substrate of each of the Examples and Comparative Example was analyzed in the thickness direction from the surface of the piezoelectric layer by SIMS using IMS-7f manufactured by CAMECA Instruments. As examples of the results, FIG. 7 shows the intensities of the elements in the sample of Example 1, FIG. 8 shows the intensities of the elements in the sample of Example 2, and FIG. 9 shows the intensities of the elements in the sample of Example 8. In each of these figures, the left side represents the piezoelectric layer surface side, and the right side is the Si substrate side. In each figure, the intensity of Co in the buffer layer is higher than the intensity of Co in the other layers (BF-BT layer) of the piezoelectric layer, and the intensity of Co in the BF-BT layer is higher than the intensity of Co in the lower electrode. Bi was contained both the buffer layer and the BF-BT layer. It was therefore shown that, in the BF-BT layer-formed substrate of each Example, a buffer layer containing Bi and Co was formed on the lower electrode while a BF-BT layer containing little Co was formed on the buffer layer.

Analysis of Crystal Orientation

Figure 10A:
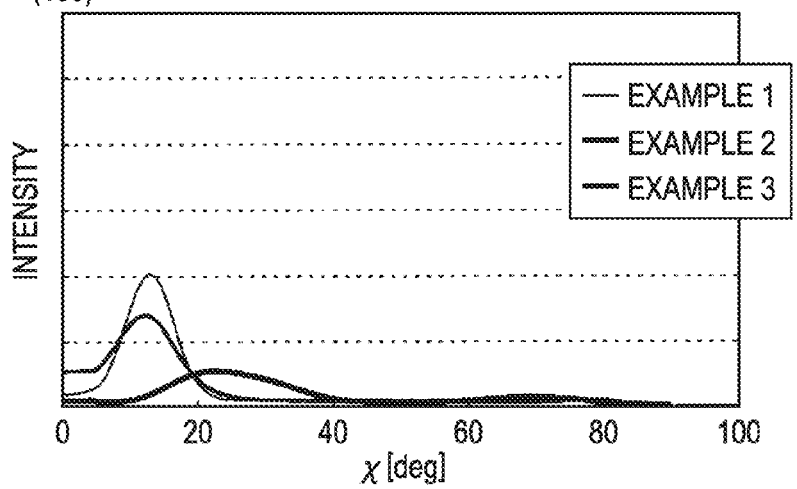
FIGS. 10A to 10C are wide angle X-ray diffraction (XRD) spectra of the piezoelectric layers of the Examples in the $\chi$ direction from the (100) plane.
Figure 10B:
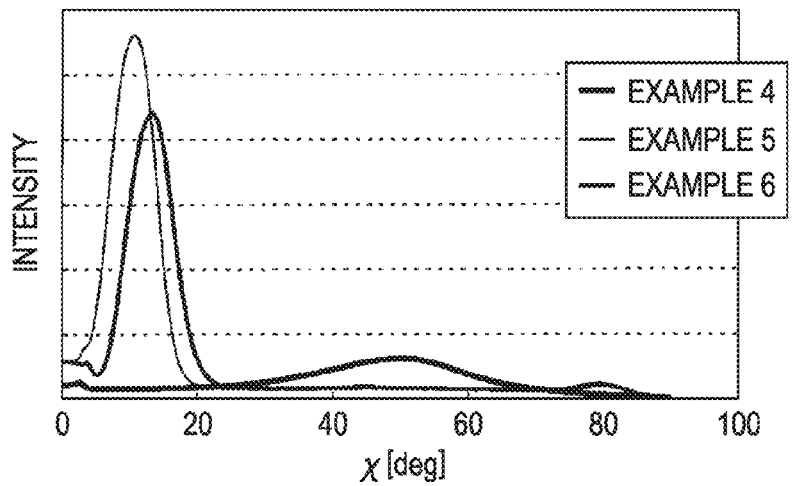
Figure 10C:
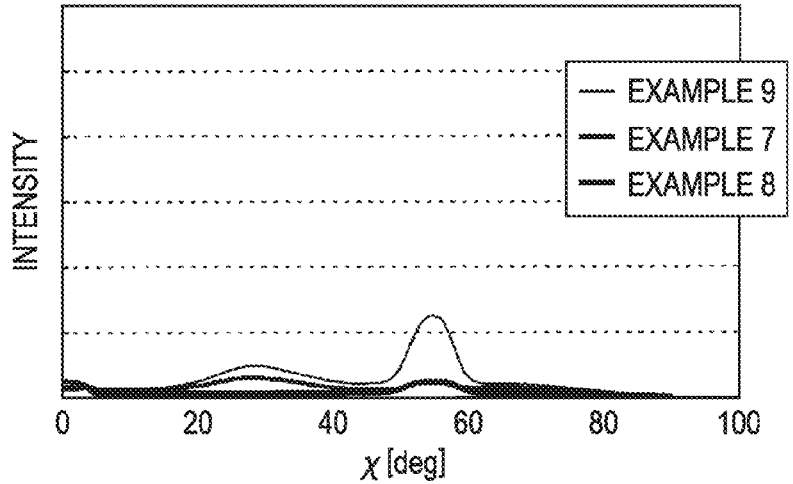
Figure 11A:
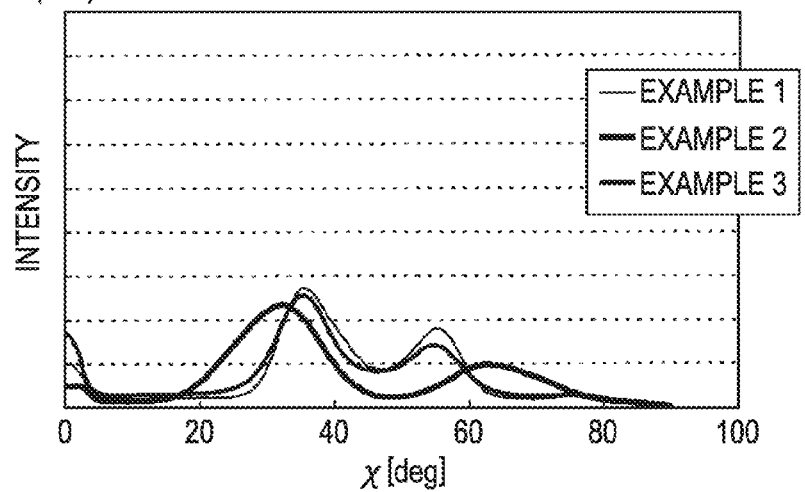
FIGS. 11A to 11C are XRD spectra of the piezoelectric layers of the Examples in the $\chi$ direction from the (110) plane.
Figure 11B:
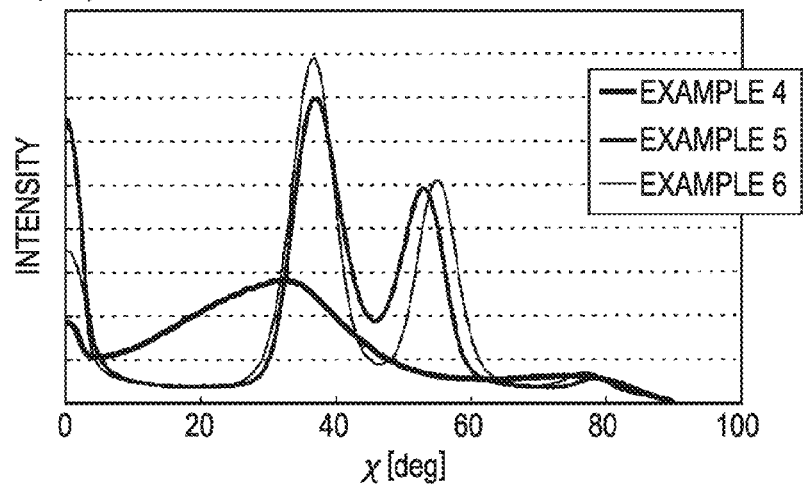
Figure 11C:
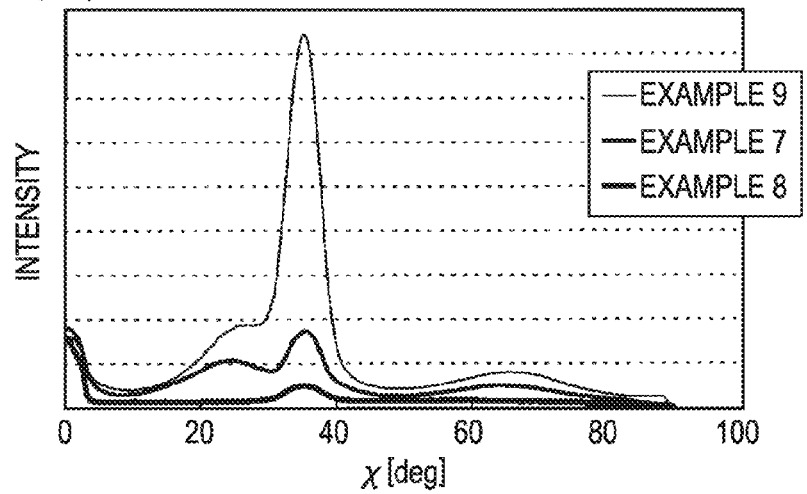

In order to analyze the crystal orientation of the piezoelectric layer of the BF-BT layer-formed substrate of each of the Examples and Comparative Example, the piezoelectric layer was subjected to wide angle X-ray diffraction (XRD) using "X'Pert PRO MRD" manufactured by PANalytical (former the analyzer section of Philips Japan Inc.) FIGS. 10A to 10C show the results of scanning of the piezoelectric layers of the Examples in the $\chi$ direction, that is, X-ray diffraction spectra obtained at an angle of $\chi$, from the (100) plane ($2\theta=22.5°$, $\theta=11.25°$), and FIGS. 11A to 11C show the results of scanning of the piezoelectric layers of the Examples in the $\chi$ direction, that is, the X-ray diffraction spectra obtained at an angle of $\chi$, from the (110) plane ($2\theta=32.0°$, $\theta=16.0°$). FIGS. 10A and 11A show the X-ray diffraction spectra of Examples 1 to 3, FIGS. 10B and 11B show the X-ray diffraction spectra of Examples 4 to 6, and FIGS. 10C and 11C show the X-ray diffraction spectra of Examples 7 to 9. When the plane formed by the incident axis and the reflection axis of X-ray radiation was perpendicular to the surface of the sample, the angle $\chi$ was defined as 0°, and the angle $\chi$ represents the tilt angle of the sample when the sample was tilted so that the incident angle and reflection angle of the x-ray radiation could be equal in a state where the X-ray generator and the detector were fixed at a position.

FIG. 12B shows the angle $\chi_{100}$ between the (100) plane and the orientated plane and the angle $\chi_{110}$ between the (110) plane and the orientated plane, for each of the Examples and Comparative Example. The angles $\chi_{100}$ and $\chi_{110}$ were obtained from the peaks in the above X-ray diffraction spectra. For reference, FIG. 12A shows the angles $\chi_{100}$ between the (100) plane and the orientated plane when the oriented layer has plane indices of <100>, the angle $\chi_{110}$ between the (110) plane and the oriented plane when the oriented layer has plane indices of <110>, and the angle $\chi_{111}$ between the (111) plane and the orientated plane when the oriented layer has plane indices of <111>. The plane indices of the oriented layer of each Example, assuming that the oriented layer has a cubic crystal structure, was obtained from the angle $\chi_{100}$ between the (100) plane and the oriented plane and the angle $\chi_{110}$ between the (110) plane and the oriented angle.

FIG. 12B also shows the plane indices of the oriented layer of each of the Examples and Comparative Example. As shown in FIG. 12B, the plane indices were different among the Examples and vary from <110>.

FIGS. 14 to 23 show the dark field images of the surfaces of the piezoelectric layers observed after 30 minutes had elapsed from their formation at a magnification of 100 times through a metallurgical microscope. FIGS. 14, 15, 16, 17, 18, 19, 20, 21 and 22 show the surfaces of the piezoelectric layers of Examples 1, 2, 3, 4, 5, 6, 7, 8 and 9, respectively, and FIG. 23 shows the surface of the piezoelectric layer of the Comparative Example. In the surface of the piezoelectric layer of the Comparative Example, in which the buffer layer was not formed, cracks are observed as shown in FIG. 23. On the other hand, in the surfaces of the piezoelectric layers of the Examples, in which the buffer layer was formed, cracks were not observed as shown in FIGS. 14 to 22. In the Examples, even after 65 hours had elapsed from the formation of the piezoelectric layer, cracks were not observed in the surface of the piezoelectric layer.

Thus, by providing the BF-BT layer with a buffer layer containing an oxide containing Bi and Co, the perovskite oxide of the BF-BT layer formed on the buffer layer can be oriented in a plane other than <110>. Consequently, the occurrence of cracks in the piezoelectric layer can be suppressed in comparison with the case where the buffer layer is not formed.

Piezoelectric Characteristics

The relationship between polarization P ($\mu$C/cm$^2$) and voltage (V) was examined for each of the Examples and Comparative Example by applying triangular waves of 1 kHz in frequency at room temperature in the atmosphere, and varying the applied voltage in steps of 5 V from 5 V to 40 V, using an electrode pattern having a diameter of 500 $\mu$m and FCE-1A manufactured by Toyo Corporation.

Figure 13A:
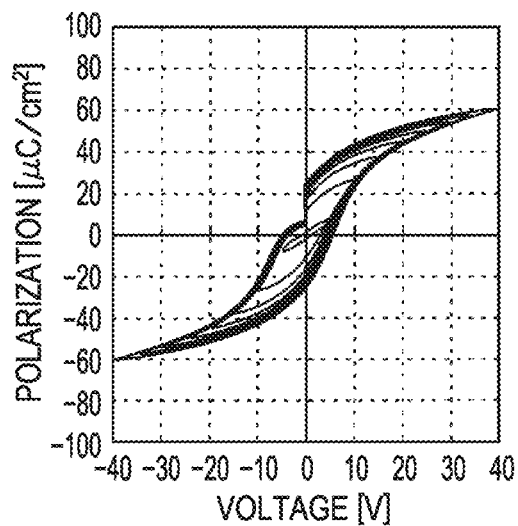
FIG. 13A is a plot showing the hysteresis of Example 2.
Figure 13B:
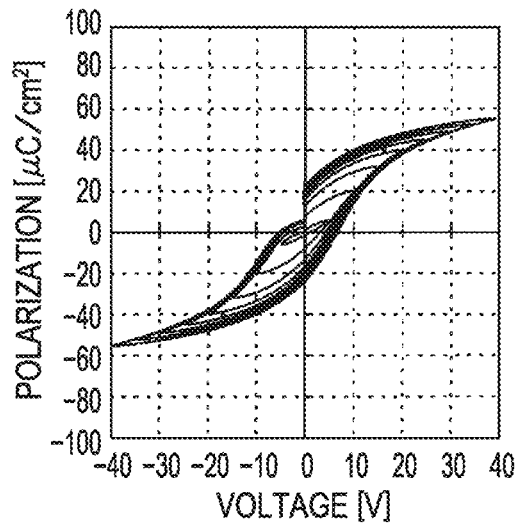
FIG. 13B is a plot showing the hysteresis of Example 4.
Figure 13C:
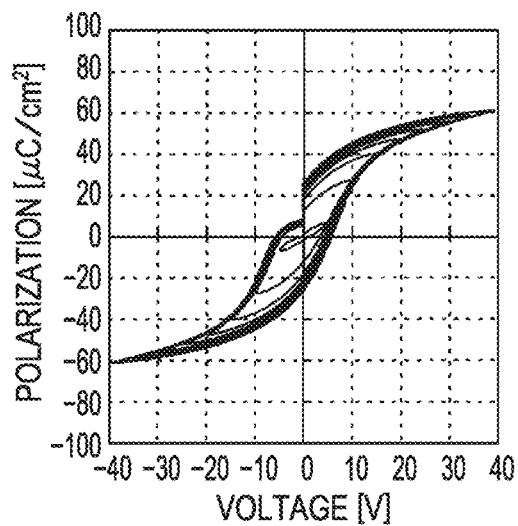
FIG. 13C is a plot showing the hysteresis of Example 8.
Figure 14:
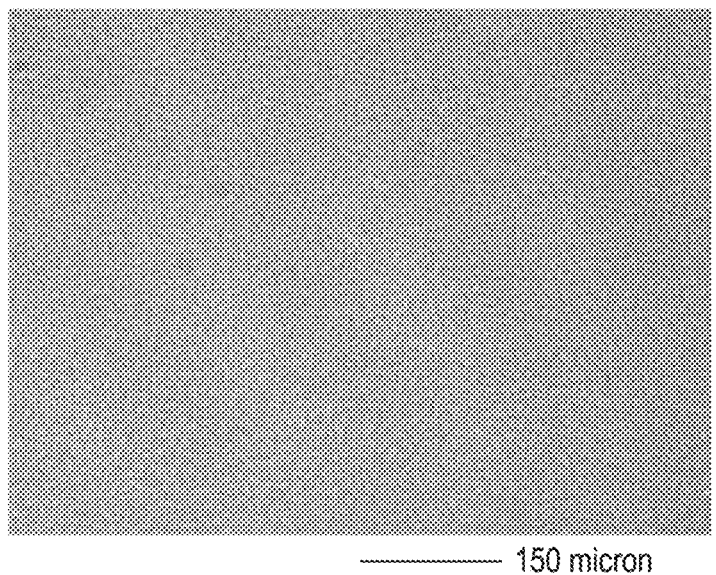
FIG. 14 is an image of the surface of a thin film of Example 1.
Figure 15:
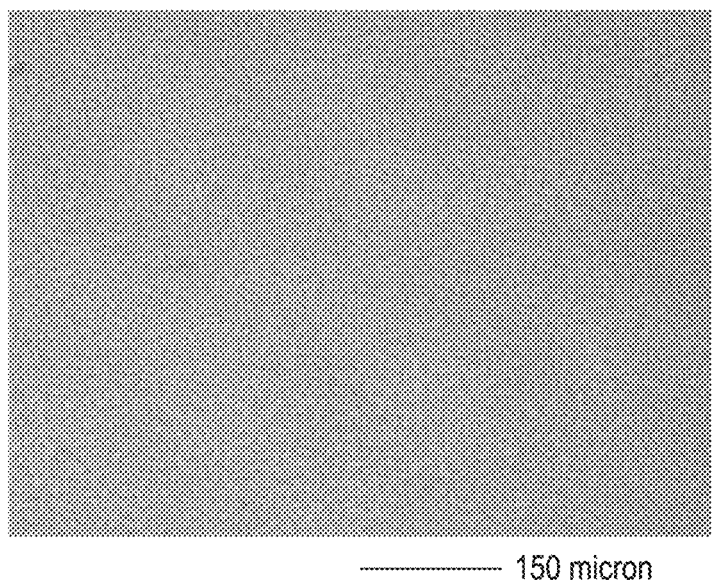
FIG. 15 is an image of the surface of a thin film of Example 2.
Figure 16:
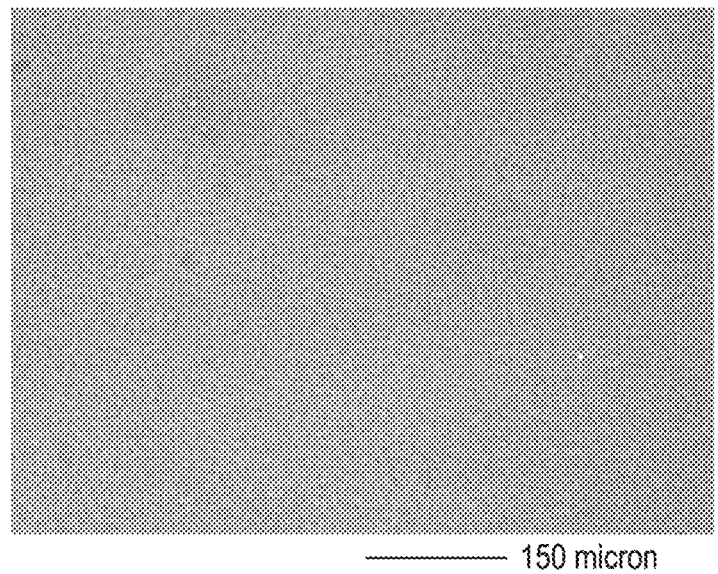
FIG. 16 is an image of the surface of a thin film of Example 3.
Figure 17:
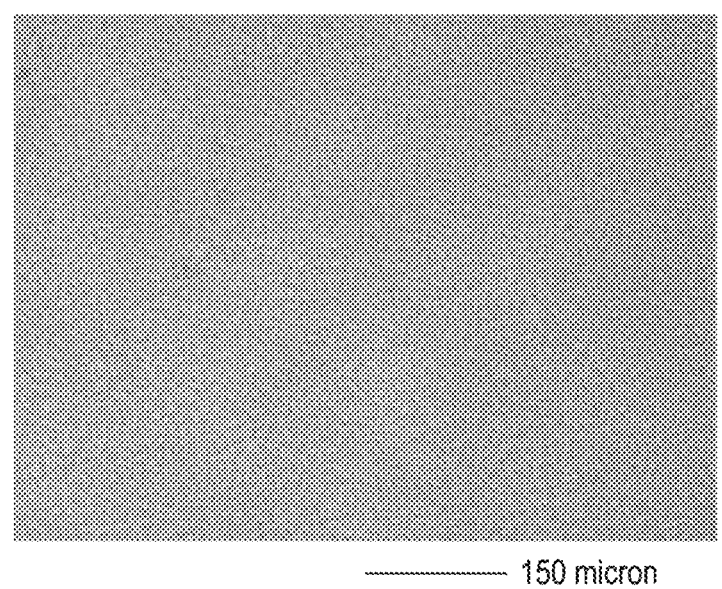
FIG. 17 is an image of the surface of a thin film of Example 4.
Figure 18:
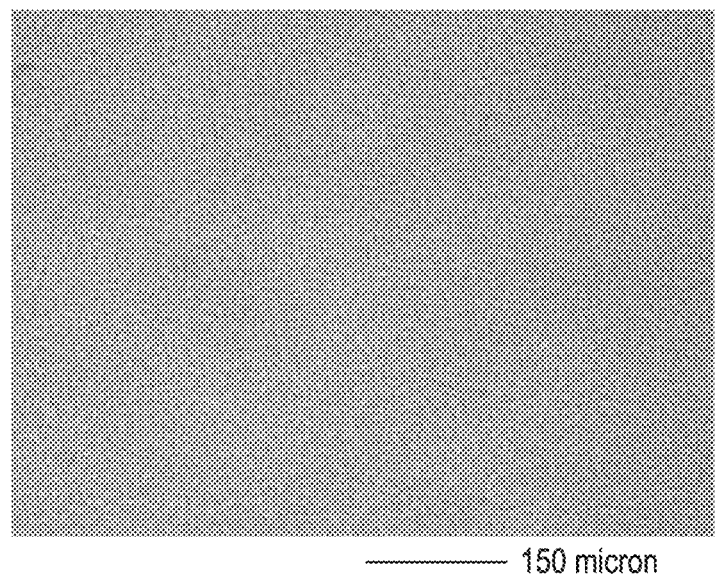
FIG. 18 is an image of the surface of a thin film of Example 5.
Figure 19:
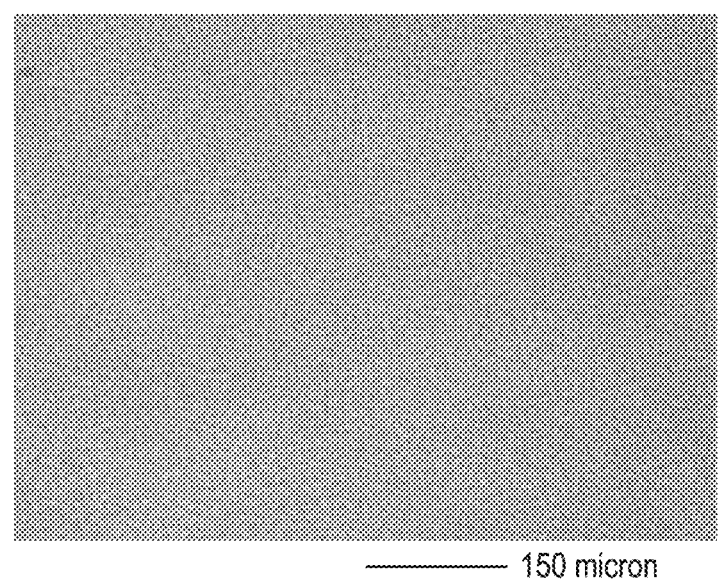
FIG. 19 is an image of the surface of a thin film of Example 6.
Figure 20:
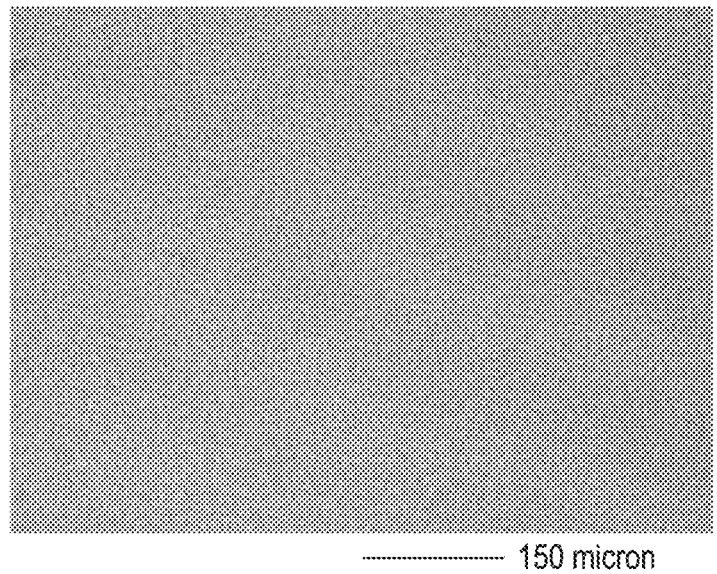
FIG. 20 is an image of the surface of a thin film of Example 7.
Figure 21:
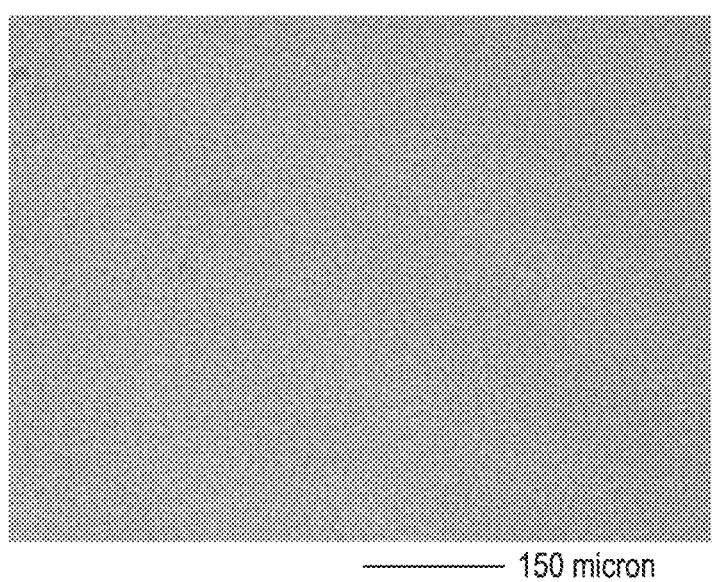
FIG. 21 is an image of the surface of a thin film of Example 8.
Figure 22:
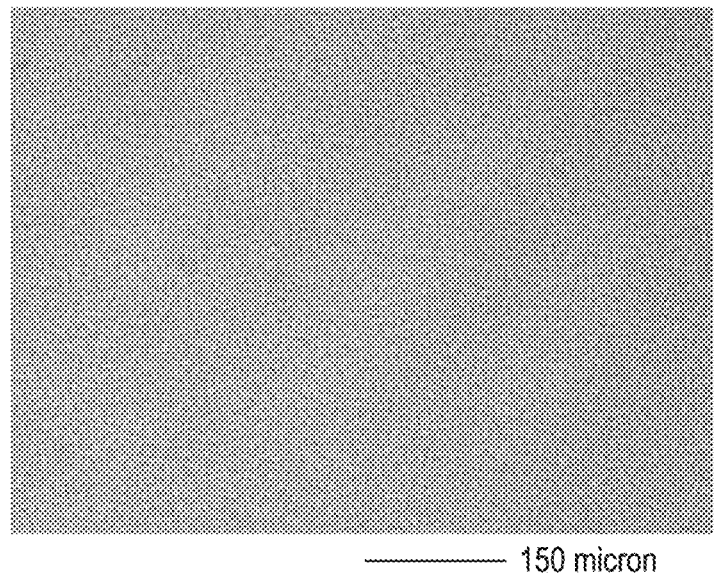
FIG. 22 is an image of the surface of a thin film of Example 9.

As examples of the results, FIG. 13A shows the hysteresis curve of Example 2, FIG. 13B shows the hysteresis curve of Example 4, and FIG. 13C shows the hysteresis curve of Example 8. As shown in FIGS. 13A to 13C, the difference in hysteresis among the Examples is not large.

These results show that the piezoelectric characteristics can be maintained even by providing the BF-BT layer with a buffer layer containing an oxide containing Bi and Co.

(5) APPLICATIONS AND OTHERS

Various modifications may be made in the invention. Although in the above embodiment, piezoelectric elements are provided, one for each pressure generating chamber, a common piezoelectric element may be provided for a plurality of pressure generating chambers in another embodiment.

Although in the above embodiment, a part of the reservoir is formed in the flow channel substrate, the reservoir may be formed in a member other than the flow channel substrate in another embodiment.

Although in the above embodiment, the piezoelectric element protecting section covers the upper side of the piezoelectric element, the upper side of the piezoelectric element may be open to the atmosphere.

Although in the above embodiment, the pressure generating chamber is formed on the side of the vibration plate opposite the piezoelectric element, the piezoelectric element may be disposed on the same side as the pressure generating chamber. For example, the pressure generating chamber may be defined by a space formed between fixed plates and between the piezoelectric elements.

Any liquid may be discharged from the liquid ejecting head as long as the liquid ejecting head can discharge the liquid. Such liquids include fluids such as a solution of a dye or the like dissolved in a solvent and a sol of a pigment or metal particles dispersed in a disperse medium. Examples of the fluid include inks and liquid crystals. The liquid ejecting head may be mounted not only in an image recording apparatus, such as a printer, but also in, for example, an apparatus for manufacturing color filters of liquid crystal display devices and the like, an apparatus for manufacturing electrodes of organic EL display devices and the like, and an apparatus for manufacturing biochips.

The multilayer ceramic composite formed by the above-described process can be suitably used for producing ferroelectric devices, pyroelectric devices, piezoelectric devices, and the ferroelectric thin films of optical filters. The ferroelectric devices include ferroelectric memory devices (Fe-RAM) and ferroelectric transistors (FeFET). The pyroelectric devices include temperature sensors, infrared detectors and temperature-electricity converters. The piezoelectric devices include fluid ejecting apparatuses, ultrasonic motors, acceleration sensors and pressure-electricity converters. The optical filters include cutoff filters of harmful light rays, such as infrared radiation, optical filters using the photonic crystal effect by quantum dot formation, and optical filters using the optical interference of a thin film.

The invention can provide techniques for enhancing the performance of piezoelectric elements, liquid ejecting heads and liquid ejecting apparatuses, using lead-free or low-lead piezoelectric materials in various embodiments.

The structures disclosed in the embodiments and modifications above may be combined in different manners or may be replaced therebetween. Also, known structures and the structures of the disclosed embodiments and modifications may be replaced therebetween or may be combined in different manners. The invention includes these structures.

What is claimed is:

1. A liquid ejecting head comprising:
 a pressure generating chamber communicating with a nozzle aperture; and
 a piezoelectric element including a piezoelectric layer and an electrode, the piezoelectric layer including a buffer layer containing an oxide containing Bi and Co and disposed on the electrode, and a layer disposed on the buffer layer and containing a perovskite oxide containing Bi, Ba, Fe and Ti,
 wherein the buffer layer includes at least one composition expressed by the following general formulas:

$$BiCoO_3 \quad (1);$$

$$(Bi,MA)CoO_3 \quad (2);$$

$$Bi(Co,MB)O_3 \quad (3);$$

$$(Bi,MA)(Co,MB)O_3 \quad (4); \text{ and}$$

MA in formulas (2) and (4) represents at least one metal element other than Bi, and MB in formulas (3) and (4) represents at least one metal element other than Co.

2. The liquid ejecting head according to claim 1, wherein the oxide of the buffer layer further contains Fe.

3. The liquid ejecting head according to claim 1, wherein the oxide of the buffer layer further contains Ti.

4. The liquid ejecting head according to claim 1, wherein the perovskite oxide further contains Mn.

5. A liquid ejecting apparatus comprising the liquid ejecting head as set forth in claim 1.

6. A liquid ejecting apparatus comprising the liquid ejecting head as set forth in claim 2.

7. A liquid ejecting apparatus comprising the liquid ejecting head as set forth in claim 3.

8. A liquid ejecting apparatus comprising the liquid ejecting head as set forth in claim 4.

9. A piezoelectric element comprising:

an electrode; and a piezoelectric layer disposed on the electrode, the piezoelectric layer including a buffer layer containing an oxide containing Bi and Co, and a layer disposed on the buffer layer and containing a perovskite oxide containing Bi, Ba, Fe and Ti, wherein the buffer layer includes at least one composition expressed by the following general formulas:

$$BiCoO_3 \quad (1);$$

$$(Bi,MA)CoO_3 \quad (2);$$

$$Bi(Co,MB)O_3 \quad (3);$$

$$(Bi,MA)(Co,MB)O_3 \quad (4); \text{ and}$$

MA in formulas (2) and (4) represents at least one metal element other than Bi, and MB in formulas (3) and (4) represents at least one metal element other than Co.

* * * * *